(12) United States Patent
Yang et al.

(10) Patent No.: US 12,532,609 B2
(45) Date of Patent: Jan. 20, 2026

(54) DISPLAY DEVICE AND METHOD FOR MANUFACTURING THE SAME

(71) Applicant: Samsung Display Co., LTD., Yongin-si (KR)

(72) Inventors: Ji Seong Yang, Suwon-si (KR); Seok-Joon Hong, Seongnam-si (KR); Jang-Il Kim, Asan-si (KR); Gyeong Eun Eoh, Seongnam-si (KR); Song Ee Lee, Seoul (KR); Si-Wan Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 940 days.

(21) Appl. No.: 17/729,670

(22) Filed: Apr. 26, 2022

(65) Prior Publication Data
US 2023/0056289 A1    Feb. 23, 2023

(30) Foreign Application Priority Data

Aug. 23, 2021   (KR) .................. 10-2021-0111063

(51) Int. Cl.
| | |
|---|---|
| *H10K 59/122* | (2023.01) |
| *H10K 50/844* | (2023.01) |
| *H10K 71/00* | (2023.01) |
| *H10K 59/12* | (2023.01) |
| *H10K 59/38* | (2023.01) |
| *H10K 102/00* | (2023.01) |

(52) U.S. Cl.
CPC ......... *H10K 59/122* (2023.02); *H10K 50/844* (2023.02); *H10K 71/00* (2023.02); *H10K 59/1201* (2023.02); *H10K 59/38* (2023.02); *H10K 2102/331* (2023.02)

(58) Field of Classification Search
None
See application file for complete search history.

(56) References Cited

U.S. PATENT DOCUMENTS

| | | |
|---|---|---|
| 10,872,931 B2 | 12/2020 | Kim et al. |
| 11,092,842 B2 | 8/2021 | Kim et al. |
| 11,423,822 B2 | 8/2022 | Park et al. |
| 11,700,757 B2 | 7/2023 | Kim et al. |

(Continued)

FOREIGN PATENT DOCUMENTS

| | | |
|---|---|---|
| KR | 10-1738452 B1 | 6/2017 |
| KR | 10-1765850 B1 | 8/2017 |

(Continued)

*Primary Examiner* — Bradley Smith
(74) *Attorney, Agent, or Firm* — Womble Bond Dickinson (US) LLP

(57) ABSTRACT

A display device and a manufacturing method thereof are provided. The display device includes a first substrate; a first color filter, a second color filter, and a third color filter that are on the first substrate; a plurality of roof layers that cover spaces that overlap the first color filter, the second color filter, and the third color filter, respectively; a first color conversion layer that is positioned in a space overlapping the first color filter; a second color conversion layer that is positioned in a space overlapping the second color filter; a transmissive layer that is positioned in a space overlapping the third color filter; and a capping layer that is positioned on the plurality of roof layers.

19 Claims, 17 Drawing Sheets

(56) References Cited

U.S. PATENT DOCUMENTS

| | | |
|---|---|---|
| 2020/0091464 A1* | 3/2020 | Park .................. H10K 59/32 |
| 2020/0326586 A1 | 10/2020 | Kim et al. |
| 2022/0302231 A1 | 9/2022 | Son et al. |
| 2022/0359798 A1 | 11/2022 | Kim et al. |

FOREIGN PATENT DOCUMENTS

| | | |
|---|---|---|
| KR | 10-1879676 B1 | 7/2018 |
| KR | 10-2019-0110660 A | 10/2019 |
| KR | 10-2020-0120793 A | 10/2020 |
| KR | 10-2021-0016198 A | 2/2021 |
| KR | 10-2022-0072058 A | 6/2022 |
| KR | 10-2022-0130295 A | 9/2022 |
| KR | 10-2022-0152463 A | 11/2022 |

\* cited by examiner

DISPLAY DEVICE AND METHOD FOR MANUFACTURING THE SAME

CROSS-REFERENCE TO RELATED APPLICATION

This application claims priority to and the benefit of Korean Patent Application No. 10-2021-0111063 filed in the Korean Intellectual Property Office on Aug. 23, 2021, the entire contents of which are hereby incorporated by reference.

BACKGROUND

1. Field

Embodiments of the present disclosure relate to a display device and a manufacturing method thereof.

2. Description of the Related Art

A display device is a device that displays a screen, and includes a liquid crystal display (LCD), an organic light emitting diode (OLED) display, and/or the like. Such a display device is used in various electronic devices such as, for example, portable phones, navigation devices, digital cameras, electron books, portable game devices, or various terminals.

An organic light emitting diode display includes two electrodes and an organic emission layer positioned between the two electrodes, and an electron injected from one electrode and a hole injected from the other electrode are combined in the organic emission layer such that an exciton is formed. As the exciton changes from an exited state to a ground state, it emits energy and emits light.

Recently, a display device including a color conversion panel has been proposed to reduce light loss and implement a display device with high color reproducibility. The color conversion panel may contain semiconductor nano-crystals such as quantum dots, and may convert incident light into different colors.

The color conversion layer of the color conversion panel may be processed through an inkjet process, and in this case, a thickness of the color conversion layer may have a different pattern depending on the position. For example, a color conversion layer may be formed by discharging ink in a region separated by a partitioning wall, and a thickness of a portion close to the partitioning wall and a thickness of a portion positioned between the partitioning walls may be different. Accordingly, problems associated with recognizing stains and changing optical characteristics may occur.

The above information disclosed in this Background section is only for enhancement of understanding of the background of the described technology, and therefore it may contain information that does not form the prior art that is already known to a person of ordinary skill in the art.

SUMMARY

Embodiments of the present disclosure are directed to a display device including a color conversion layer having a uniform (e.g., substantially uniform) thickness and a manufacturing method thereof.

A display device according to an embodiment includes: a first substrate; a first color filter, a second color filter, and a third color filter that are on the first substrate; a plurality of roof layers that cover spaces that overlap the first color filter, the second color filter, and the third color filter, respectively; a first color conversion layer that is positioned in a space overlapping the first color filter; a second color conversion layer that is positioned in a space overlapping the second color filter; a transmissive layer that is positioned in a space overlapping the third color filter; and a capping layer that is positioned on the plurality of roof layers.

The first color conversion layer includes a plurality of first quantum dots and a plurality of scatterers; the second color conversion layer includes a plurality of second quantum dots and a plurality of scatterers; and the transmissive layer includes a plurality of scatterers.

The display device according to the embodiment further includes a partitioning wall that is positioned between the plurality of roof layers, wherein the capping layer may be positioned on the partitioning wall.

An upper surface of the partitioning wall may have hydrophobicity.

The display device according to the embodiment further includes a low refractive index layer that is positioned on the first color filter, the second color filter, and the third color filter, wherein the low refractive index layer may be positioned between the first color filter and the first color conversion layer, between the second color filter and the second color conversion layer, and between the third color filter and the transmissive layer.

The display device according to the embodiment further includes a low refractive index layer that is positioned on the first color conversion layer, the second color conversion layer, and the transmissive layer, wherein the first color conversion layer may be between the first color filter and the low refractive index layer, the second color conversion layer may be between the second color filter and the low refractive index layer, and the transmissive layer may be between the third color filter and the low refractive index layer.

The display device according to the embodiment further includes: a second substrate that includes a first pixel, a second pixel, and a third pixel; and a plurality of light emitting elements that are respectively on the first pixel, the second pixel, and the third pixel of the second substrate, wherein a light emitting element on the first pixel may overlap the first color filter and the first color conversion layer, a light emitting element on the second pixel may overlap the second color filter and the second color conversion layer, and a light emitting element on the third pixel may overlap the third color filter and the transmissive layer.

The first substrate further includes a first pixel, a second pixel, and a third pixel, the display device further includes a plurality of light emitting elements that are on the first pixel, the second pixel, and the third pixel of the substrate, respectively, a light emitting element on the first pixel may be positioned between the first substrate and the first color conversion layer, while overlapping the first color filter and the first color conversion layer, a light emitting element on the second pixel may be positioned between the first substrate and the second color conversion layer, while overlapping the second color filter and the second color conversion layer, and a light emitting element on the third pixel may be positioned between the first substrate and the transmissive layer, while overlapping the third color filter and the transmissive layer.

The roof layer may include: a first roof layer formed of an inorganic material; a second roof layer that is positioned on the first roof layer, and is formed of an organic material; and a third roof layer that is positioned on the second roof layer, and is formed of an inorganic material.

The display device according to the embodiment may further include a filling layer that is positioned on the capping layer;

A manufacturing method of a display device according to an embodiment includes: forming a first color filter, a second color filter, and a third color filter on a first substrate; forming a sacrificial layer on each of the first color filter, the second color filter, and the third color filter; forming a roof layer on the sacrificial layer; forming a space covered by the roof layer by removing the sacrificial layer; forming a first color conversion layer, a second color conversion layer, and a transmissive layer by injecting ink into the space; and forming a capping layer on the roof layer.

In the manufacturing method of the display device according to the embodiment, the first color conversion layer includes a plurality of first quantum dots and a plurality of scatterers, the second color conversion layer includes a plurality of second quantum dots and a plurality of scatterers, and the transmissive layer includes a plurality of scatterers.

The manufacturing method of the display device according to the embodiment further includes forming a partitioning wall between the plurality of roof layers, wherein in the forming of the partitioning wall, the sacrificial layer may be removed.

The sacrificial layer may be formed of a positive photoresist, and the partitioning wall may be formed of a negative photoresist.

The manufacturing method of the display device according to the embodiment further includes forming a low refractive index layer on the first color filter, the second color filter, and the third color filter, wherein the low refractive index layer may be positioned between the first color filter and the first color conversion layer, between the second color filter and the second color conversion layer, and between the third color filter and the transmissive layer.

The manufacturing method of the display device according to the embodiment further includes forming a low refractive index layer on the first color conversion layer, the second color conversion layer, and the transmissive layer, wherein the first color conversion layer may be positioned between the first color filter and the low refractive index layer, the second color conversion layer may be positioned between the second color filter and the low refractive index layer, and the transmissive layer may be positioned between the third color filter and the low refractive index layer.

The manufacturing method of the display device according to the embodiment may further include: forming a plurality of light emitting diodes on a second substrate; and aligning the first substrate and the second substrate to face each other and bonding them.

The manufacturing method of the display device according to the embodiment may further include forming a plurality of light emitting diodes on the first substrate, wherein the forming the sacrificial layer on the plurality of light emitting diodes, forming the roof layer, forming the space, forming the first color conversion layer, the second color conversion layer, and the transmissive layer, and forming the capping layer may be sequentially formed, and then the forming the first color filter, the second color filter, and the third color filter on the first color conversion layer, the second color conversion layer, and the transmissive layer may be carried out.

The forming the roof layer may include: forming a first roof layer formed of an inorganic material; forming a second roof layer formed of an organic material on the first roof layer; and forming a third roof layer formed of an inorganic material on the second roof layer.

The manufacturing method of the display device according to the may further include forming a filling layer on the capping layer.

According to the embodiments, in a display device including a color conversion layer, the thickness of the color conversion layer may be uniformly (e.g., substantially uniformly) formed.

DETAILED DESCRIPTION

Figure 1:
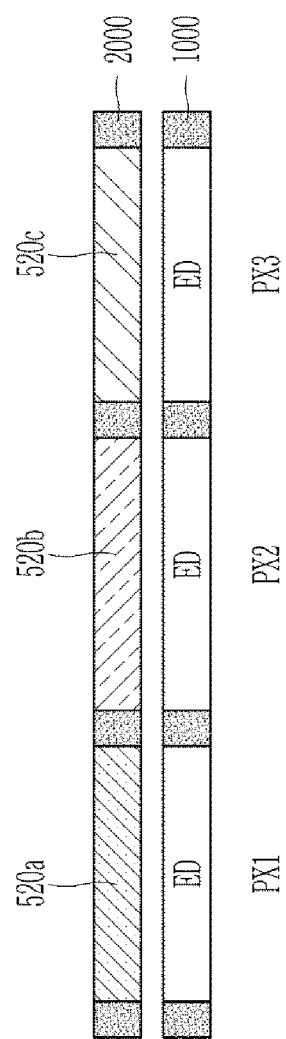
FIG. 1 is a schematic cross-sectional view of a display device according to an embodiment.

Aspects of embodiments of the present disclosure will be described more fully hereinafter with reference to the accompanying drawings, in which embodiments of the disclosure are shown. As those skilled in the art would realize, the described embodiments may be modified in various different ways.

The drawings and description are to be regarded as illustrative in nature and not restrictive. Like reference numerals designate like elements throughout the specification.

In addition, because the size and thickness of each configuration shown in the drawings may be arbitrarily indicated for better understanding and ease of description, the subject matter of the present disclosure is not necessarily limited to the drawings. In the drawings, the thickness of layers, films, panels, regions, etc., may be exaggerated for clarity. In addition, in the drawings, the thickness of some layers and regions may be exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Hereinafter, a display device according to an embodiment will be described with reference to FIG. 1 to FIG. 3.

Figure 2:
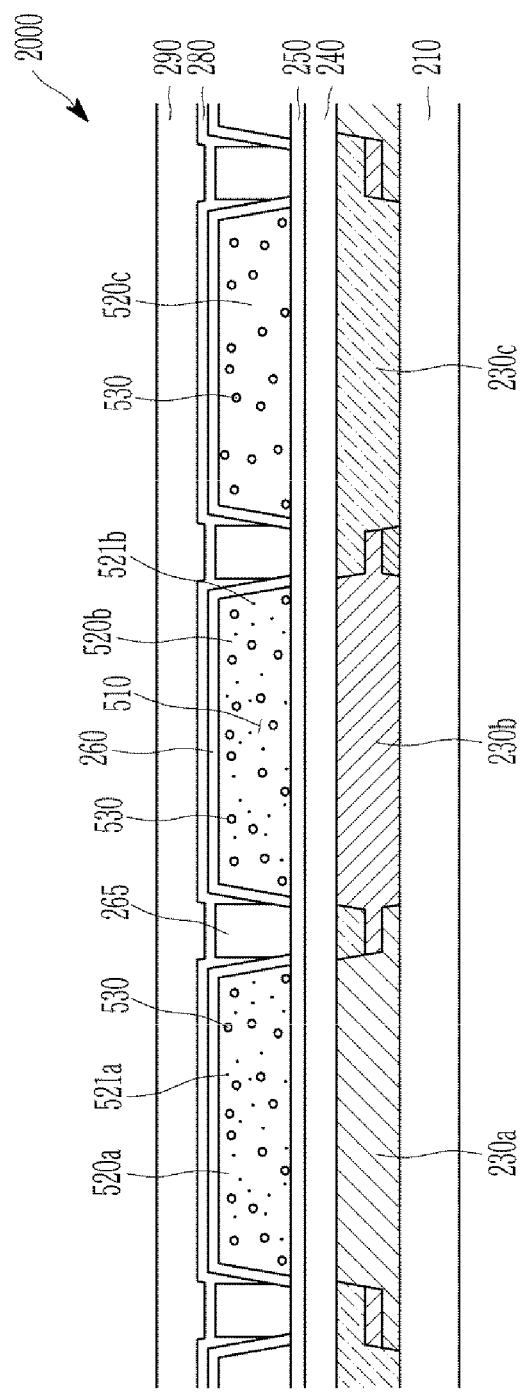
FIG. 2 is a cross-sectional view of a part of the display device according to the embodiment.
Figure 3:
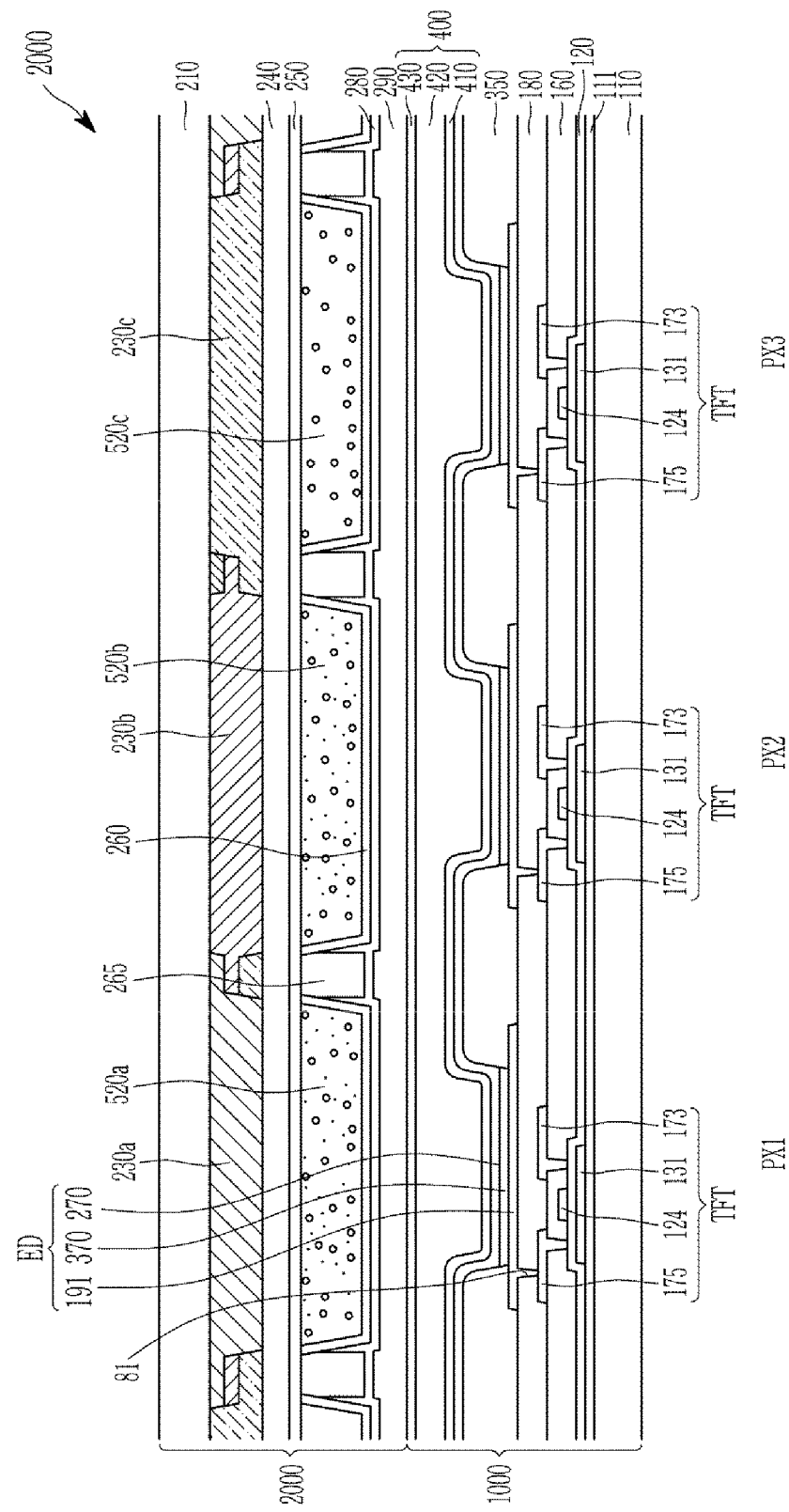
FIG. 3 is a cross-sectional view of the display device according to the embodiment.

FIG. 1 is a schematic cross-sectional view of a display device according to an embodiment, FIG. 2 is a cross-sectional view of a part of the display device according to the embodiment, and FIG. 3 is a cross-sectional view of the display device according to the embodiment. FIG. 2 shows a color conversion panel of the display device according to the embodiment.

As shown in FIG. 1, a display device according to an embodiment includes a display panel 1000 and a color conversion panel 2000 that overlap each other.

The display panel 1000 may include a plurality of pixels PX1, PX2, and PX3, and a light emitting diode ED may be positioned in each of the pixels PX1, PX2, and PX3. For example, the display panel 1000 may include a plurality of light emitting diodes ED. The plurality of pixels PX1, PX2, and PX3 may include a first pixel PX1, a second pixel PX2, and a third pixel PX3. Each light emitting diode ED may emit light, and the display panel 1000 may display a screen by adjusting light emitted from the light emitting diodes ED of the respective pixels PX1, PX2, and PX3.

The light emitting diode ED may be formed of an organic light emitting element, and the display panel 1000 may be formed of an organic light emitting panel. However, the type of display panel 1000 is not limited thereto, and various suitable types of panels may be used. For example, the display panel 1000 may be formed of a liquid crystal panel, an electrophoretic display panel, an electrowetting display panel, and the like. In addition, the display panel 1000 may be formed of a next generation display panel such as a micro light emitting diode (Micro LED) display panel and the like.

The display panel 1000 may be formed of a flat rigid display panel or a flexible display panel that can be flexibly bent.

The color conversion panel 2000 may face the display panel 1000. The color conversion panel 2000 may include a first color conversion layer 520a, a second color conversion layer 520b, and a transmissive layer 520c. The first color conversion layer 520a may overlap the light emitting diode ED positioned on the first pixel PX1. Light emitted from the light emitting diode ED of the first pixel PX1 may pass through the first color conversion layer 520a to emit light of a first wavelength. The second color conversion layer 520b may overlap the light emitting diode ED positioned on the second pixel PX2. Light emitted from the light emitting diode ED of the second pixel PX2 may pass through the second color conversion layer 520b to emit light of a second wavelength. The transmissive layer 520c may overlap the light emitting diode ED positioned on the third pixel PX3. The light emitted from the light emitting diode ED of the third pixel PX3 may pass through the transmissive layer 520c to emit light of a third wavelength. For example, the light of the first wavelength may be red light, the light of the second wavelength may be green light, and the light of the third wavelength may be blue light. In some embodiments, the first pixel PX1, the second pixel PX2, and the third pixel PX3 may be a red pixel, a green pixel, and a blue pixel, respectively. However, the present disclosure is not limited thereto, and colors displayed by the first pixel PX1, the second pixel PX2, and the third pixel PX3 may be variously changed. In addition, in addition to the first pixel PX1, the second pixel PX2, and the third pixel PX3, a pixel displaying a different color may be additionally included.

Hereinafter, a layering structure of the color conversion panel of the display device according to the embodiment will be described with reference to FIG. 2.

The color conversion panel 2000 may include a substrate 210, and a first color filter 230a, a second color filter 230b, and a third color filter 230c positioned on the substrate 210.

The first color filter 230a transmits the light of the first wavelength and may absorb the light of the remaining wavelength, thereby increasing the purity of the light of the first wavelength emitted to the outside of the display device.

The second color filter 230b transmits the light of the second wavelength and may absorb the light of the remaining wavelength, thereby increasing the purity of the light of the second wavelength emitted to the outside of the display device.

The third color filter 230c transmits the light of the third wavelength and may absorb the light of the remaining wavelength, thereby increasing the purity of the light of the third wavelength emitted to the outside of the display device.

The first color filter 230a, the second color filter 230b, and the third color filter 230c may be positioned to overlap different pixels PX1, PX2, and PX3, respectively. At the boundary of each pixel PX1, PX2, and PX3, the first color filter 230a, the second color filter 230b, and the third color filter 230c may overlap each other to form a light blocking region. In the light blocking region, the first color filter 230a, the second color filter 230b, and the third color filter 230c are illustrated to overlap, but is not limited thereto. For example, two color filters among the first color filter 230a, the second color filter 230b, and the third color filter 230c may overlap to form a light blocking region. For example, the first color filter 230a and the second color filter 230b may overlap at the boundary between the first pixel PX1 and the second pixel PX2. The second color filter 230b and the third color filter 230c may overlap at the boundary between the second pixel PX2 and the third pixel PX3. The third color filter 230c and the first color filter 230a may overlap at the boundary between the third pixel PX3 and the first pixel PX1.

A low refractive index layer 240 may be positioned on the first color filter 230a, the second color filter 230b, and the third color filter 230c. The low refractive index layer 240 may overlap all of the first color filter 230a, the second color filter 230b, and the third color filter 230c. In some embodiments, the low refractive index layer 240 may be entirely positioned on the substrate 210. The low refractive index layer 240 may include an organic material or an inorganic material having a low refractive index. For example, the refractive index of the low refractive index layer 240 may be greater than or equal to about 1.1 and less than or equal to about 1.3.

A first capping layer 250 may be positioned on the low refractive index layer 240. The first capping layer 250 is a layer for protecting the low refractive index layer 240 and may include an inorganic insulating material such as a silicon nitride (SiNx), a silicon oxide (SiOx), or a silicon oxynitride (SiOxNy). The first capping layer 250 may be a single-layer or multi-layer structure of the material.

A roof layer 260 is positioned on the first capping layer 250 to cover the space 510 overlapping each of the pixels PX1, PX2, and PX3. The roof layer 260 may be formed to cover an upper surface and a side surface of a space 510 of each pixel. A plurality of roof layers 260 covering each space 510 may be formed to be separated from each other. However, the present disclosure is not limited thereto, and at least a portion of a plurality of roof layers 260 covering each space 510 may be connected to each other. For example, a plurality of roof layers 260 adjacent to each other along one direction may be connected to each other. The roof layer 260 may include an inorganic insulating material such as a silicon nitride (SiNx), a silicon oxide (SiOx), or a silicon oxynitride (SiOxNy). The roof layer 260 may be a single-layer or multi-layer structure of the material.

A first color conversion layer 520a, a second color conversion layer 520b and a transmissive layer 520c may be positioned in the plurality of spaces 510 covered by the roof layer 260, respectively. Each of the plurality of spaces 510 is filled with a first color conversion layer 520a, a second color conversion layer 520b, and a transmissive layer 520c. In space 510, a thickness of the first color conversion layer 520a may be constant. A thickness of the second color conversion layer 520b in the space 510 may be constant. In space 510, a thickness of the transmissive layer 520c may be constant. Accordingly, the optical characteristics of each of the pixels PX1, PX2, and PX3 may be maintained uniformly (e.g., substantially uniformly) as a whole.

The first color conversion layer 520a may overlap the first color filter 230a. The first color conversion layer 520a may not overlap the second color filter 230b and the third color filter 230c. The first color conversion layer 520a may convert light incident from the light emitting diode ED of the first pixel PX1 into the light of the first wavelength. In this case, the light of the first wavelength may be red light having a maximum light emitting peak wavelength of about 600 nm to about 650 nm, for example, about 620 nm to about 650 nm. The first color conversion layer 520a may include a plurality of first quantum dots 521a and a plurality of scatterers 530 (e.g., a plurality of light scatterers 530).

The second color conversion layer 520b may overlap the second color filter 230b. The second color conversion layer 520b may not overlap the first color filter 230a and the third color filter 230c. The second color conversion layer 520b may convert light incident from the light emitting diode ED of the second pixel PX2 into the light of the second wavelength. In this case, the light of the second wavelength may be green light having a maximum light emitting peak wavelength of about 500 nm to about 550 nm, for example, about 510 nm to about 550 nm. The second color conversion layer 520b may include a plurality of second quantum dots 521b and a plurality of scatterers 530 (e.g., a plurality of light scatterers 530).

The transmissive layer 520c may overlap the third color filter 230c. The transmissive layer 520c may not overlap the first color filter 230a and the second color filter 230b. The transmissive layer 520c may transmit light incident from the light emitting diode ED of the third pixel PX3. Light passing through the transmission layer 520c may be the light of the third wavelength. The light of the third wavelength may be blue light having a maximum light emitting peak wavelength of about 380 nm to about 480 nm, for example, about 420 nm or more, about 430 nm or more, about 440 nm or more, or about 445 nm or more, and about, 470 nm or less, about 460 nm or less, or about 455 nm or less. The transmissive layer 520c may include a plurality of scatterers 530 (e.g., a plurality of light scatterers 530).

The plurality of scatterers 530 may improve light efficiency by scattering light incident to the first color conversion layer 520a, the second color conversion layer 520b, and the transmissive layer 520c.

The first quantum dot 521a and the second quantum dot 521b (hereinafter, also referred to as semiconductor nanocrystals) each may independently include a group II-VI compound, a group III-V compound, a group IV-VI compound, a group IV element or compound, and a I-III-group VI compound, a group II-III-VI compound, a group I-II-IV-VI compound, or a combination thereof. The quantum dot may not contain cadmium.

The group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgSe, HgZnS, HgZnTe, HgZnS, HgZnS, HgZnSg, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The II-VI compound may further include the group III metal.

The group III-V compound may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The III-V compound may further include a group II metal (e.g., InZnP).

The group IV-VI compound may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof.

The group IV element or compound is a single element compound selected from the group consisting of Si, Ge, and a combination thereof; and a binary compound selected from SiC, SiGe, and a combination thereof, but is not limited thereto.

Examples of the group compound include, but are not limited to, CuInSe2, CuInS2, CuInGaSe, and CuInGaS. Examples of the group I-II-IV-VI compound include, but are not limited to, CuZnSnSe, and CuZnSnS. The group IV element or compound is a single element compound selected from the group consisting of Si, Ge, and a mixture thereof; and a binary compound selected from SiC, SiGe, and a mixture thereof, but is not limited thereto.

The group compound may be selected from the group consisting of ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof, but is not limited thereto.

The group I-II-IV-VI compound may be selected from, but is not limited to, CuZnSnSe and CuZnSnS.

In one embodiment, the quantum dot may not include cadmium. The quantum dot may contain semiconductor nanocrystals based on III-V compounds including indium and phosphorus. The group III-V compound may further include zinc. The quantum dot may include a semiconductor nanocrystal based on a group II-VI compound including a chalcogen element (e.g., sulfur, cell rhenium, tellurium, or a combination thereof) and zinc.

In the quantum dot, the above-mentioned binary compound, a ternary element compound, and/or quaternary compound may exist in a particle (e.g., in separate particles) at a uniform (e.g., substantially uniform) concentration, or may exist in the same particle because the concentration distribution is partially divided into different states (e.g., different portions of the same particle). In addition, one quantum dot may have a core/shell structure surrounding another quantum dot. The interface between the core and the shell may have a concentration gradient in which the concentration of elements present in the shell decreases toward the center.

In some embodiments, a quantum dot may have a core-shell structure including a core containing the nanocrystals described above and a shell surrounding the core. The shell of the quantum dot may serve as a protective layer to maintain the semiconductor characteristic by preventing or reducing chemical denaturation of the core and/or as a charging layer to impart an electrophoretic characteristic to the quantum dot. The shell may be single-layered or multi-layered. The interface between the core and the shell may have a concentration gradient in which the concentration of elements present in the shell decreases toward the center. Examples of the shell of the quantum dot include a metal or non-metal oxide, a semiconductor compound, or a combination thereof.

For example, the metal or non-metal oxide may be a binary element compound $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like, or a ternary element component such as $MgAl_2O_4$, $CoFe_2O_4$, $NiFe_2O_4$, $CoMn_2O_4$, and the like, but the present disclosure is not limited thereto.

In addition, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the present disclosure is not limited thereto.

The interface between the core and the shell may have a concentration gradient in which the concentration of elements present in the shell decreases toward the center. In addition, the semiconductor nanocrystal may have a structure including one semiconductor nanocrystal core and a multi-layered shell surrounding the semiconductor nanocrystal core. In one implementation, the multi-layered shell may have two or more layers, for example, two, three, four, five, or more layers. Two adjacent layers of the shell may have a single composition or a different composition. In a multi-layered shell, each layer may have a composition that varies along the radius.

The quantum dot may have a full width of half maximum (FWHM) of a light emitting wavelength spectrum of about 45 nm or less, about 40 nm or less, or, for example, about 30 nm or less, and within these ranges, color purity or color reproducibility can be improved. In addition, light emitted through such a quantum dot is emitted in all directions, and accordingly, a light viewing angle can be improved.

In the quantum dot, the shell material and the core material may have different energy bandgaps. For example, the energy bandgap of the shell material may be greater than that of the core material. In other embodiments, the energy bandgap of the shell material may be smaller than that of the core material. The quantum dot may have a multi-layered shell. In a multi-layered shell, the energy bandgap of the outer layer may be larger than the energy bandgap of the inner layer (e.g., a layer closer to the core). In the multi-layered shell, the energy bandgap of the outer layer may be smaller than the energy bandgap of the inner layer.

The quantum dot may control absorption/light emitting wavelength by controlling composition and size. The maximum light emitting peak wavelength of the quantum dot may have a wavelength range of ultraviolet (UV) to infrared wavelength or higher.

The quantum dot may contain an organic ligand (e.g., having a hydrophobic moiety and/or a hydrophilic moiety). The organic ligand moiety may be bound to the surface of the quantum dot. The organic ligand may include RCOOH, $RNH_2$, $R_2NH$, $R_3N$, RSH, $R_3PO$, $R_3P$, ROH, RCOOR, RPO$(OH)_2$, RHPOOH, $R_2POOH$, or a combination thereof, where R denotes each independently a substituted or unsubstituted C3 to C40 (e.g., C5 or more and C24 or less) aliphatic hydrocarbon group such as substituted or unsubstituted alkyl of C3 to C40, substituted or unsubstituted alkenyl, and the like, a substituted or unsubstituted C6 to C40 (e.g., C6 or more and C20 or less) aromatic hydrocarbon group such as substituted or unsubstituted aryl group or a combination thereof.

Examples of the organic ligand may include a thiol compound such as methane thiol, ethane thiol, propane thiol, butane thiol, pentane thiol, hexane thiol, octane thiol, dodecane thiol, hexadecane thiol, octadecane thiol, benzyl thiol; amines such as methanamine, ethanamine, propane amine, butanamine, pentylamine, hexylamine, octylamine, nonylamine, decylamine, dodecylamine, hexadecylamine, octadecylamine, dimethylamine, diethylamine, dipropylamine, tributylamine and trioctylamine; a carboxylic acid compound such as methanoic acid, ethanoic acid, propane acid, butanoic acid, pentanoic acid, hexanoic acid, heptanoic acid, octanoic acid, dodecanoic acid, hexadecanoic acid, octadecanoic acid, oleic acid, and benzoic acid; a phosphine compounds such as methyl phosphine, ethyl phosphine, propyl phosphine, butyl phosphine, pentyl phosphine, octyl phosphine, dioctyl phosphine, tributyl phosphine, trioctyl phosphine, and the like; a phosphine compound such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, trioctyl phosphine oxide, or an oxide compound thereof; diphenyl oxide, triphenyl oxide compound, or an oxide compound thereof; and C5 to C20 alkyl phosphinic acid such as hexyl phosphonic acid, octyl phosphonic acid, dodecane phosphonic acid, tetradecane phosphonic acid, hexadecane phosphonic acid, and octadecane phosphonic acid, C5 to C20 alkyl phosphonic acid, and the like, but this is not restrictive. The quantum dot may contain hydrophobic organic ligand alone or as a mixture of one or more types. The hydrophobic organic ligand may not contain a photopolymerizable moiety (e.g., an acrylate group, a methacrylate group, etc.).

A partitioning wall 265 may be positioned between a plurality of adjacent roof layers 260. The partitioning wall 265 may overlap a light blocking region where the first color filter 230a, the second color filter 230b, and the third color filter 230c overlap. Accordingly, the partitioning wall 265 may be positioned at the boundary between the pixels PX1, PX2, and PX3. The partitioning wall 265 may overlap the edge of the roof layer 260. However, the present disclosure is not limited thereto, and the partitioning wall 265 does not overlap the roof layer 260 and may be spaced apart.

A second capping layer 280 may be positioned on the roof layer 260 and partitioning wall 265. The second capping layer 280 may be positioned entirely on the substrate 210. The second capping layer 280 is a layer that covers the first color conversion layer 520a, the second color conversion layer 520b, and the transmissive layer 520c, and may be formed of an inorganic material. For example, the second capping layer 280 may include an inorganic insulating material such as a silicon nitride (SiNx), a silicon oxide (SiOx), silicon oxynitride (SiOxNy), and the like. The second capping layer 280 may be a single-layer or multi-layer structure of the material.

A filling layer 290 may be positioned on the second capping layer 280. The filling layer 290 may be positioned entirely over the substrate 210. The filling layer 290 is positioned between the display panel 1000 and the color conversion panel 2000 in the state where the display panel 1000 and color conversion panel 2000 are bonded.

Hereinafter, referring to FIG. 3, the state where the display panel 1000 and color conversion panel 2000 are bonded will be described. In FIG. 3, the color conversion panel 2000 shown in FIG. 2 may be combined to face the display panel 1000 with the top and bottom turned upside down.

The display panel 1000 may include a substrate 110, a semiconductor 131 on the substrate 110, a transistor TFT including a gate electrode 124, a source electrode 173, and a drain electrode 175, a gate insulating layer 120, a first interlayer insulating layer 160, a second interlayer insulating layer 180, a pixel electrode 191, an emission layer 370, a bank layer 350, a common electrode 270, and an encapsulation layer 400.

The substrate 110 may include a material having a rigid characteristic, such as glass, or a flexible material that can be bent, such as plastic or polyimide. A buffer layer 111 to flatten the surface of the substrate 110 and block impurity from penetrating into the semiconductor 131 may be further positioned on the substrate 110. The buffer layer 111 may include an inorganic material, and for example, may include an inorganic insulating material such as a silicon nitride (SiNx), a silicon oxide (SiOx), a silicon oxynitride (SiOxNy), and the like. The buffer layer 111 may be a single-layer or multi-layer structure of the material. A barrier layer (not shown) may be further positioned on the substrate 110. In this case, the barrier layer may be between the substrate 110 and the buffer layer 111. The barrier layer may include an inorganic insulating material such as a silicon nitride (SiNx), a silicon oxide (SiOx), a silicon oxynitride (SiOxNy), and the like. The barrier layer BA may be a single-layer or multi-layer structure of the material.

The semiconductor 131 may be positioned on the substrate 110. The semiconductor 131 may include any one chosen from amorphous silicon, polysilicon, and an oxide semiconductor. For example, the semiconductor 131 may include low temperature polysilicon (LTPS) or an oxide semiconductor material containing at least one chosen from zinc (Zn), indium (In), gallium (Ga), tin (Sn), and a mixture thereof.

For example, the semiconductor 131 may include an indium-gallium-zinc oxide (IGZO). The semiconductor 131 may include a channel region, a source region, and a drain region that are classified according to whether or not impurity doping is performed. The source region and drain region may have conduction characteristics corresponding to the conductors.

The gate insulating layer 120 may cover the semiconductor 131 and the substrate 110. The gate insulating layer 120 may include an inorganic insulating material such as a silicon nitride (SiNx), a silicon oxide (SiOx), a silicon oxynitride (SiOxNy), and the like. The gate insulating layer 120 may be a single-layer or multi-layer structure of the material.

The gate electrode 124 may be positioned on the gate insulating layer 120. The gate electrode 124 may include a metal such as copper (Cu), molybdenum (Mo), aluminum (Al), silver (Ag), chromium (Cr), tantalum (Ta), titanium (Ti), and the like or a metal alloy. The gate electrode 124 may be formed as a single layer or multiple layers. A region of the semiconductor 131 that overlaps the gate electrode 124 on a plane may be a channel region.

The first interlayer insulating layer 160 may cover the gate electrode 124 and the gate insulating layer 120. The first interlayer insulating layer 160 may include an inorganic insulating material such as a silicon nitride (SiNx), a silicon oxide (SiOx), a silicon oxynitride (SiOxNy), and the like. The first interlayer insulating layer 160 may be a single layer or multi-layer structure of the material.

The source electrode 173 and drain electrode 175 may be positioned on the first interlayer insulating layer 160. The source electrode 173 and the drain electrode 175 are connected to the source region and the drain region of the semiconductor 131 by openings formed in the first interlayer insulating layer 160 and the gate insulating layer 120, respectively. The above-stated semiconductor 131, gate electrode 124, source electrode 173, and drain electrode 175 form one transistor TFT. Depending on embodiments, the transistor TFT may include only the source region and the drain region of the semiconductor 131 instead of the source electrode 173 and the drain electrode 175. Although one transistor TFT is illustrated in each of the pixels PX1, PX2, and PX3, the present disclosure is not limited thereto, and a plurality of transistors TFT may be positioned in each of the pixels PX1, PX2, and PX3.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or a metal alloy. The source electrode 173 and drain electrode 175 may be formed as a single layer or multiple layers. The source electrode 173 and drain electrode 175 according to the embodiment may be formed of a triple layer including an upper layer, an middle layer, and a lower layer, the upper layer and the lower layer may include titanium (Ti), and the middle layer includes aluminum (Al).

The second interlayer insulating layer 180 may be positioned on the source electrode 173 and the drain electrode 175. The second interlayer insulating layer 180 covers the source electrode 173, the drain electrode 175, and the first interlayer insulating layer 160. The second interlayer insulating layer 180 is for planarizing the surface of the substrate 110 equipped with the transistor TFT, and may be an organic insulator, and may include a material selected from the group consisting of polyimide, polyamide, acryl resin, benzocyclobutene, and a phenol resin.

The pixel electrode 191 may be positioned on the second interlayer insulating layer 180. The pixel electrode 191 is also called an anode, and may be formed of a single layer including a transparent conductive oxide film or a metallic material, or a multi-layer including them. The transparent conductive oxide layer may include an indium tin oxide (ITO), a poly-ITO, indium zinc oxide (IZO), an indium gallium zinc oxide (IGZO), and an indium tin zinc oxide (ITZO). The metallic material may include silver (Ag), molybdenum (Mo), copper (Cu), gold (Au), and aluminum (Al).

The second interlayer insulating layer 180 may include a via hole 81 exposing the drain electrode 175. The drain electrode 175 and the pixel electrode 191 may be physically and electrically connected through the via hole 81 of the second interlayer insulating layer 180. Accordingly, the pixel electrode 191 may receive an output current to be transferred from the drain electrode 175 to the emission layer 370.

A bank layer 350 may be positioned on the pixel electrode 191 and the second interlayer insulating layer 180. The bank layer 350 is also called a pixel defining layer PDL, and includes a pixel opening 351 that overlaps at least a part of the pixel electrode 191. In this case, the pixel opening 351 may overlap a center portion of the pixel electrode 191, and may not overlap an edge portion of the pixel electrode 191. Accordingly, the size of the pixel opening 351 may be smaller than the size of the pixel electrode 191. The bank layer 350 may partition a formation position of the emission layer 370 such that the emission layer 370 may be positioned on a portion where an upper surface of the pixel electrode 191 is exposed. The bank layer 350 may be an organic insulator including at least one material selected from the group consisting of polyimide, polyamide, acryl resin, benzocyclobutene, and phenol resin. Depending on embodiments, the bank layer 350 may be formed as a black pixel define layer (BPDL) including a black color pigment.

The bank layer 350 may be positioned at a boundary between a plurality of pixels PX1, PX2, and PX3. The bank layer 350 may overlap the partitioning wall 265. In addition, the bank layer 350 may overlap a light blocking region where a first color filter 230a, a second color filter 230b, a the third color filter 230c overlap.

A plurality of pixel openings 351 each may have a shape similar to that of the pixel electrode 191 on a plane. For example, the pixel opening 351 and the pixel electrode 191 may be formed in the shape of a polygon on a plane. In this case, corner portions of the pixel opening 351 and the pixel electrode 191 may be chamfered. However, the shape of the pixel opening 351 and the shape of the pixel electrode 191 are not limited thereto, and may be variously changed.

In this case, a plurality of pixel electrodes 191 corresponding to each of the first pixel PX1, the second pixel PX2, and the third pixel PX3 may have different sizes on a plane. Similarly, a plurality of pixel openings 351 corresponding to each of the first pixel PX1, the second pixel PX2, and the third pixel PX3 may have different sizes on a plane. For example, the pixel opening 351 and the pixel electrode 191 corresponding to the first pixel PX1 may be larger than the pixel opening 351 and the pixel electrode 191 corresponding to the second pixel PX2 on a plane, respectively. In addition, the pixel opening 351 and pixel electrode 191 corresponding to the first pixel PX1 may be smaller than or similar to the pixel opening 351 and pixel electrode 191 corresponding to the third pixel PX3 on a plane, respectively. However, the present disclosure is not limited thereto, and each of the pixel opening 351 and the pixel electrode 191 may be set to have various suitable sizes.

The emission layer 370 may be positioned within the pixel opening 351 partitioned by the bank layer 350. The emission layer 370 may include a low molecular or high molecular organic material. Although the emission layer 370 is illustrated as a single layer, auxiliary layers such as an electron injection layer, an electron transport layer, a hole transport layer, and a hole injection layer may be included above and below the emission layer 370. The hole injection layer and the hole transport layer may be positioned below the emission layer 370, and the electron transport layer and the electron injection layer may be positioned above the emission layer 370. In addition, another emission layer may be further positioned on the emission layer 370. In some embodiments, two or more emission layers 370 may be stacked.

In some embodiments, a spacer may be further positioned on the bank layer 350. The spacer may include the same material (or substantially the same material) as the bank layer 350. However, this is not restrictive, and the spacer may be formed of a material that is different from the bank layer 350. The spacer may be an organic insulator containing at least one material selected from the group consisting of polyimide, polyamide, acryl resin, benzocyclobutene, and phenol resin.

The common electrode 270 may be positioned on the bank layer 350 and the emission layer 370. The common electrode 270 of each pixel PX1, PX2, and PX3 may be connected to each other. The common electrode 270 may be formed to be entirely connected to the substrate 110. The common electrode 270 is also called a cathode, and may be formed of a transparent conductive layer including Indium a tin oxide (ITO), an indium zinc oxide (IZO), an indium gallium zinc oxide (IGZO), and an indium tin zinc oxide (ITZO). The common electrode 270 may be formed of a metallic material such as silver (Ag) or magnesium (Mg), or a mixture thereof. In this case, a thickness of the common electrode 270 may be adjusted to form a transparent conductive layer. In addition, the common electrode 270 may have a translucent characteristic, and in this case, it may form a microcavity together with the pixel electrode 191.

The pixel electrode 191, the emission layer 370, and the common electrode 270 may form a light emitting diode ED. In each of the pixels PX1, PX2, and PX3, an overlapping portion of the pixel electrode 191, the emission layer 370, and the common electrode 270 may be a light emitting region of each light emitting diode ED.

A light emitting diode ED positioned at the first pixel PX1 may overlap the first color conversion layer 520a and the first color filter 230a. The light emitting diode ED positioned at the first pixel PX1 may not overlap the second color conversion layer 520b, the transmissive layer 520c, the second color filter 230b, and the third color filter 230c. Light emitted from the light emitting diode ED of the first pixel PX1 may be converted into light of the first wavelength while passing through the first color conversion layer 520a, and may be emitted to the outside through the first color filter 230a.

A light emitting diode ED positioned on the second pixel PX2 may overlap the second color conversion layer 520b and the second color filter 230b. The light emitting diode ED positioned at the second pixel PX2 may not overlap the first color conversion layer 520a, the transmissive layer 520c, the first color filter 230a, and the third color filter 230c. Light emitted from the light emitting diode ED of the second pixel PX2 passes through the second color conversion layer 520b and is converted into light of the second wavelength, and may be emitted to the outside through the second color filter 230b.

A light emitting diode ED positioned on the third pixel PX3 may overlap the transmissive layer 520c and the third color filter 230c. The light emitting diode ED positioned at the third pixel PX3 may not overlap the first color conversion layer 520a, the second color conversion layer 520b, the first color filter 230a, and the second color filter 230b. Light of the third wavelength emitted from the light emitting diode ED of the third pixel PX3 may sequentially pass through the transmissive layer 520c and the first color filter 230a and be emitted to the outside.

An encapsulation layer 400 may be positioned over the common electrode 270. The encapsulation layer 400 may include at least one inorganic layer and at least one organic layer. In the present embodiment, the encapsulation layer 400 may include a first inorganic encapsulation layer 410, an organic encapsulation layer 420, and a second inorganic encapsulation layer 430. However, this is only an example, and the number of inorganic and organic layers forming the encapsulation layer 400 may be variously changed. For example, the encapsulation layer 400 may be stacked in the order of the first inorganic encapsulation layer, the second inorganic encapsulation layer, the first organic encapsulation layer, and the third inorganic encapsulation layer. In some embodiments, the encapsulation layer 400 may be stacked in the order of the first inorganic encapsulation layer, the first organic encapsulation layer, the second inorganic encapsulation layer, and the third inorganic encapsulation layer. The display panel 1000 may include a display area that displays a screen and a peripheral area that surrounds the display area. The first inorganic encapsulation layer 410, the organic encapsulation layer 420, and the second inorganic encapsulation layer 430 may be positioned in the display area and a portion of peripheral area. Depending on embodiments, the organic encapsulation layer 420 may be formed around the display area, and the first inorganic encapsulation layer 410 and the second inorganic encapsulation layer 430 may be formed even in the peripheral area. The encapsulation layer 400 is to protect the light emitting diode ED from moisture or oxygen that may inflow from the outside, and one ends of the first inorganic encapsulation layer 410 and the second inorganic encapsulation layer 430 may be formed to directly contact.

The encapsulation layer 430 may be in contact with the color conversion panel 2000. The encapsulation layer 430 may contact the filling layer 290. A second inorganic encapsulation layer 430 may contact the filling layer 290. However, this is only an example, and another layer may be further positioned between the encapsulation layer 430 and the filling layer 290.

In some embodiments, the display device according to the embodiment may further include a detection portion for detecting a touch. The detector may include a plurality of detection electrodes, and the detection portion may be positioned between the display panel 1000 and the color conversion panel 2000.

Next, further referring to FIG. 4 to FIG. 12, a manufacturing method of a display device according to an embodiment will be described.

FIG. 4 to FIG. 8, FIG. 10, and FIG. 12 are cross-sectional views of a process according to the sequence of a manufacturing process of a display device according to an embodiment. FIG. 9 is a perspective view showing one step of the manufacturing process of the display device according to the embodiment, and FIG. 11 is a top plan view showing one step of the manufacturing process of the display device according to the embodiment.

Figure 4:
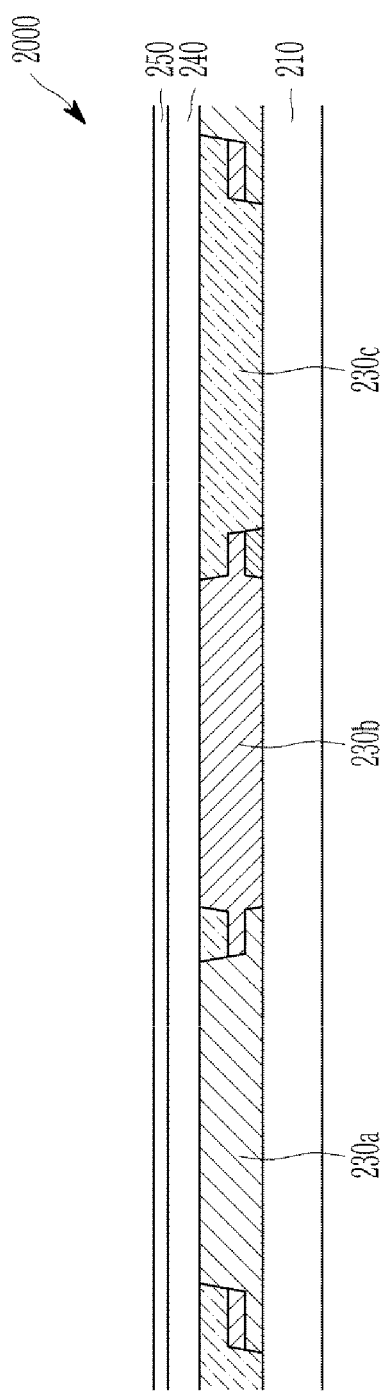
FIG. 4 to FIG. 8, FIG. 10 and FIG. 12 are cross-sectional views of a process according to the sequence of a manufacturing process of a display device according to an embodiment.

First, as shown in FIG. 4, the first color filter 230a, the second color filter 230b, and the third color filter 230c are sequentially formed on the substrate 210.

A material that can transmit light of the first wavelength is applied on the substrate 210, and the first color filter 230a is formed by patterning the material. Then, a material capable of transmitting light of the second wavelength is applied and patterned to form the second color filter 230b. Then, a material that can transmit light of the third wavelength is applied, and patterned to form the third color filter 230c.

In some regions, at least two of the first color filter 230a, the second color filter 230b, and the third color filter 230c may be formed to overlap each other. The first color filter 230a, the second color filter 230b, and the third color filter 230c may overlap each other to form a light blocking region.

Next, a low refractive index layer 240 may be formed on the first color filter 230a, the second color filter 230b, and the third color filter 230c by using a material having a low refractive index. The low refractive index layer 240 may be entirely formed on the substrate 210, and a process for patterning may not be performed separately. The low refractive index layer 240 may include an organic material or an inorganic material having a low refractive index of about 1.1 or more and about 1.3 or less.

Next, a first capping layer 250 may be formed on the low refractive index layer 240 using an inorganic material. The first capping layer 250 may be formed entirely on the substrate 210, and a process for patterning may not be performed separately. The first capping layer 250 may include an inorganic insulating material such as a silicon nitride (SiNx), a silicon oxide (SiOx), a silicon oxynitride (SiOxNy), and the like. The first capping layer 250 may be a single-layer or multi-layer structure of the material.

Figure 5:
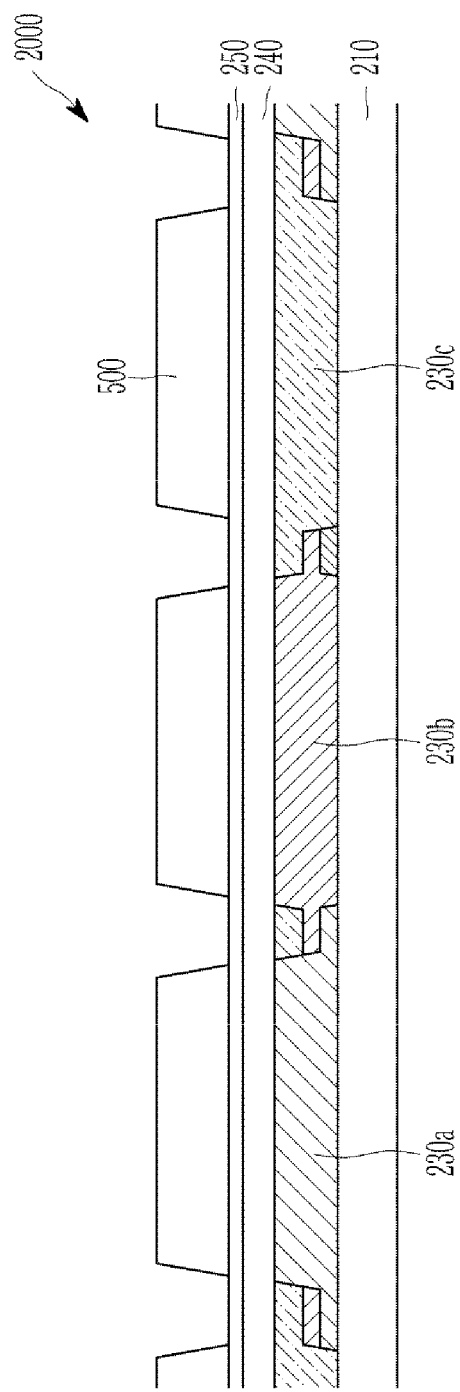

As shown in FIG. 5, a photosensitive material is coated on the first capping layer 250 and patterned through a photo process to form a sacrificial layer 500. The sacrificial layer 500 may be formed of a positive photo resist. The sacrificial layer 500 may overlap the first color filter 230a, the second color filter 230b, and the third color filter 230c. The sacrificial layer 500 may not overlap a light blocking region in which at least two of the first color filter 230a, the second color filter 230b, and the third color filter 230c overlap.

Figure 6:
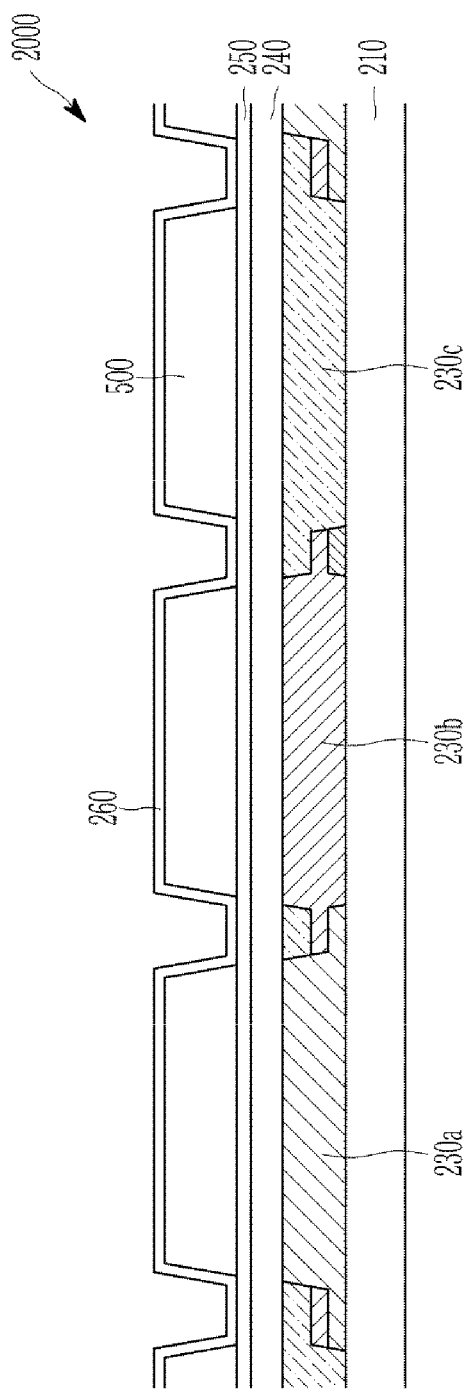

As shown in FIG. 6, a roof layer 260 may be formed on the sacrificial layer 500. The roof layer 260 is formed to cover the upper surface and the side surface of the sacrificial layer 500. The roof layer 260 may include an inorganic insulating material such as a silicon nitride (SiNx), a silicon oxide (SiOx), a silicon oxynitride (SiOxNy), and the like. The roof layer 260 may be a single-layer or multi-layer structure of the material.

Figure 7:
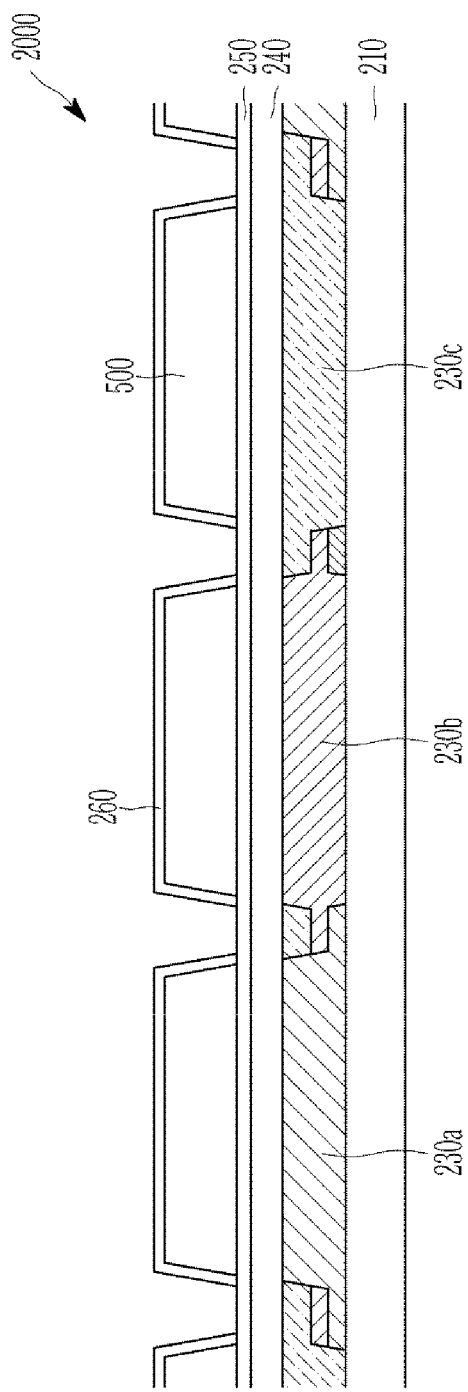

As shown in FIG. 7, a portion of the roof layer 260 positioned between the adjacent sacrificial layers 500 may be removed by patterning the roof layer 260. The roof layer 260 may not overlap the light blocking region in which at least two of the first color filter 230a, the second color filter 230b, and the third color filter 230c overlap. Accordingly, a plurality of roof layers 260 separated from each other may be formed.

Figure 8:
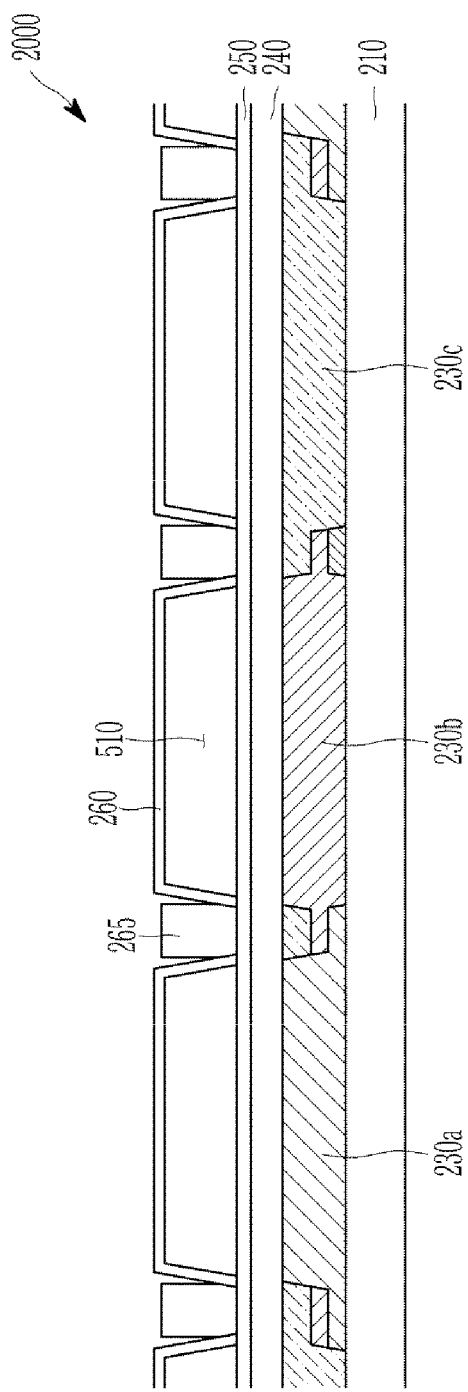
Figure 9:
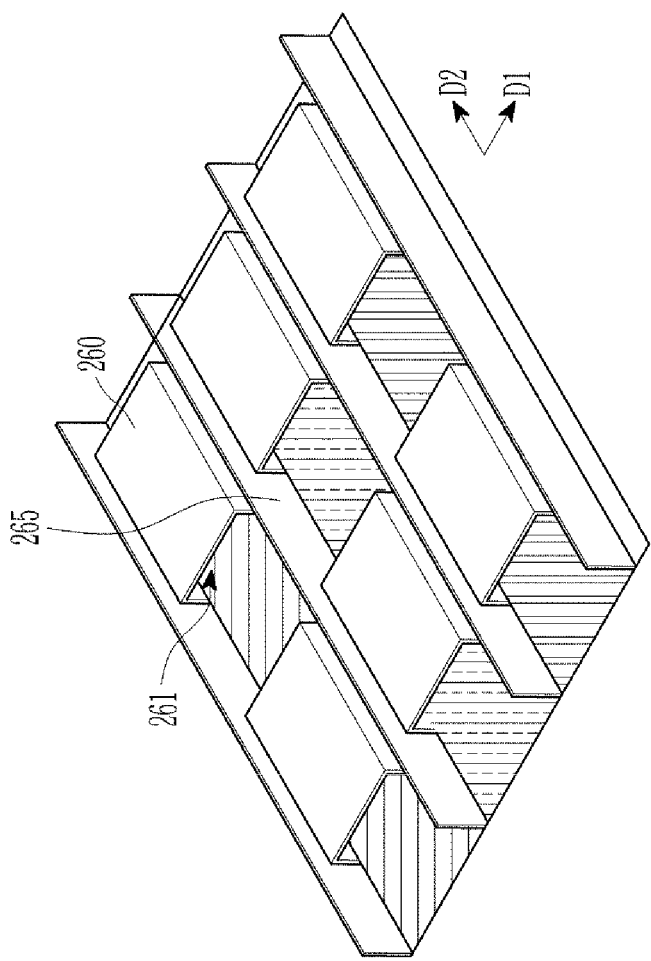
FIG. 9 is a perspective view showing one step of the manufacturing process of the display device according to the embodiment.

As shown in FIG. 8 and FIG. 9, a photosensitive material is coated on the roof layer 260 and patterned through a photo process to form a partitioning wall 265.

The partitioning wall 265 may be formed of negative photoresist. The partitioning wall 265 may be patterned to be positioned between the plurality of roof layers 260. The partitioning wall 265 may overlap a light blocking region where the first color filter 230a, the second color filter 230b, and the third color filter 230c overlap. In this case, the partitioning wall 265 may partially overlap the roof layer 260. The partitioning wall 265 may overlap the edge of the roof layer 260. However, the present disclosure is not limited thereto, and the partitioning wall 265 may be patterned to be spaced apart from the roof layer 260 without overlapping it.

The partitioning wall 265 may be formed between the adjacent roof layers 260 in the first direction D1. The partitioning wall 265 may extend long along a second direction D2 that is perpendicular (e.g., substantially perpendicular) to the first direction D1. The partitioning wall 265 may have a hydrophobic upper surface.

In the process of patterning the roof layer 260, adjacent roof layers 260 in the second direction D2 may be formed to be separated from each other without being connected to each other. Accordingly, the sacrificial layer 500 positioned under the roof layer 260 may be exposed to the outside. In the process of patterning the partitioning wall 265, the sacrificial layer 500 may be removed together. When the sacrificial layer 500 is removed, a space 510 may be formed in a place where the sacrificial layer 500 was positioned. In some embodiments, the space 510 covered by the roof layer 260 is formed, and the roof layer 260 has a shape covering the upper surface and the side surface of the space 510. In this case, a portion of the side surface of the space 510 may be exposed without being covered by the roof layer 260. As described, a portion where the space 510 positioned under the roof layer 260 is exposed may be an injection hole 261. The injection hole 261 is positioned between the adjacent roof layers 260 in the second direction D2.

Figure 10:
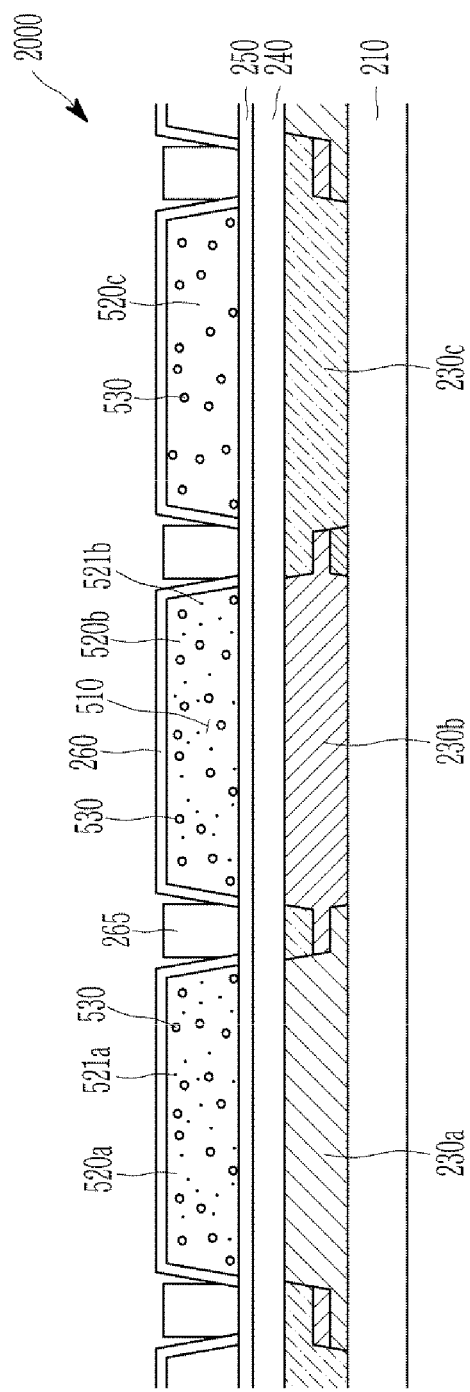
Figure 11:
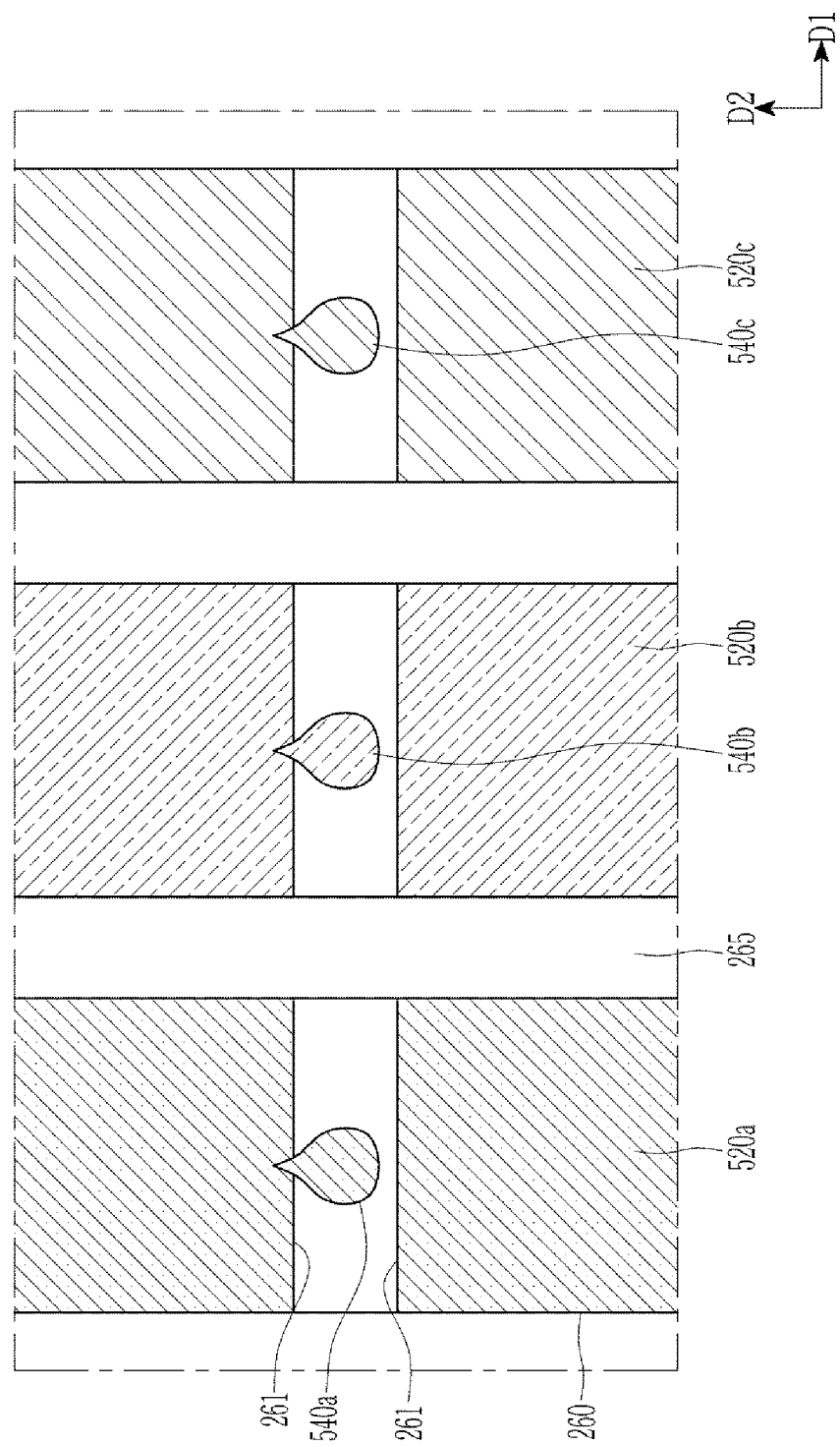
FIG. 11 is a top plan view showing one step of the manufacturing process of the display device according to the embodiment.

As shown in FIG. 10 and FIG. 11, an inkjet process may be performed to form the first color conversion layer 520a, the second color conversion layer 520b, and the transmissive layer 520c in the space 510 covered by the roof layer 260. When inks 540a, 540b, and 540c are dropped between the adjacent roof layers 260 in the second direction D2, the inks 540a, 540b, and 540c may be injected into the space 510 through the injection hole 261 by capillary force.

First, when a first ink 540a including a first quantum dot 521a and a scatterer 530 (e.g., a light scatterer 530) is dropped around the injection hole 261 exposing the space 510 overlapping with a first color filter 230a, the first ink 540a is injected into the space 510 such that the first color conversion layer 520a may be formed. The first color conversion layer 520a may overlap the first color filter 230a. The first color conversion layer 520a may not overlap the second color filter 230b and the third color filter 230c.

Then, when a second ink 540b including a second quantum dot 521b and a scatterer 530 (e.g., a light scatterer 530) is dropped around the injection hole 261 exposing the space 510 overlapping with a second color filter 230b, the second ink 540b is injected into the space 510 such that the second color conversion layer 520b may be formed.

The second color conversion layer 520b may overlap the second color filter 230b. The second color conversion layer 520b may not overlap the first color filter 230a and the third color filter 230c.

Then, when a third ink 540c including a scatterer 530 (e.g., a light scatter 530) is dropped around the injection hole 261 exposing the space 510 overlapping with a third color filter 230c, the third ink 540c is injected into the space 510 to form the transmissive layer 520c. The transmissive layer 520c may overlap the third color filter 230c. The transmissive layer 520c may not overlap the first color filter 230a and the second color filter 230b.

Because the partitioning wall 265 is positioned between the adjacent roof layers 260 in the first direction D1, and the upper surface of the partitioning wall 265 is formed of hydrophobic, it is possible to prevent or reduce injection of the ink 540a, 540b, and 540c into another space 510. For example, while the first ink 540a is injected into the space 510 overlapping with the first color filter 230a, injection of the first ink 540a into the space 510 overlapping with the second color filter 230b or the third color filter 230c may be prevented or reduced.

Figure 12:
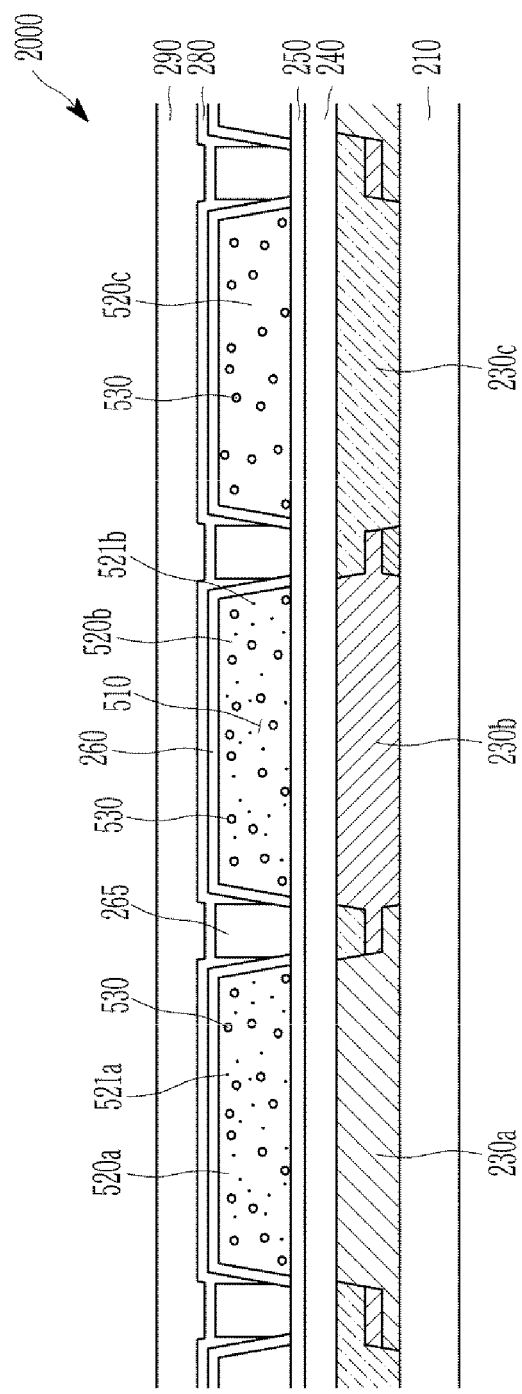

As shown in FIG. 12, a second capping layer 280 may be formed on the roof layer 260 and the partitioning wall 265 using an inorganic material. The second capping layer 280 may be formed entirely on the substrate 210, and a process for patterning may not be performed separately.

The second capping layer 280 may include an inorganic insulating material such as a silicon nitride (SiNx), a silicon oxide (SiOx), or a silicon oxynitride (SiOxNy).

The second capping layer 280 may be a single-layer or multi-layer structure of the material. The injection hole 261 may be sealed by the second capping layer 280. The second capping layer 280 may be formed to cover the upper surface and the side surface of the roof layer 260.

Next, a filling layer 290 may be formed on the second capping layer 280. The filling layer 290 may be entirely formed on the second capping layer 280, and a process for patterning may not be performed separately.

As described above, the color conversion panel 2000 may be formed, and the display panel 1000 may be formed separately therefrom. Next, the display panel 1000 and the color conversion panel 2000 may be aligned to face each other and then bonded together.

In the display device according to the embodiment, the space 510 covered by the roof layer 260 is formed, and the inks 540a, 540b, and 540c are injected into the space 510 to form the first color conversion layer 520a, the second color conversion layer 520b, and the transmissive layer 520c. Accordingly, the space 510 may have a constant height, and the first color conversion layer 520a, the second color conversion layer 520b, and the transmissive layer 520c formed in the space 510 may have a constant thickness. Accordingly, the optical characteristics of each of the pixels PX1, PX2, and PX3 may be kept constant as a whole.

Next, referring to FIG. 13, a display device according to an embodiment will be described.

Figure 13:
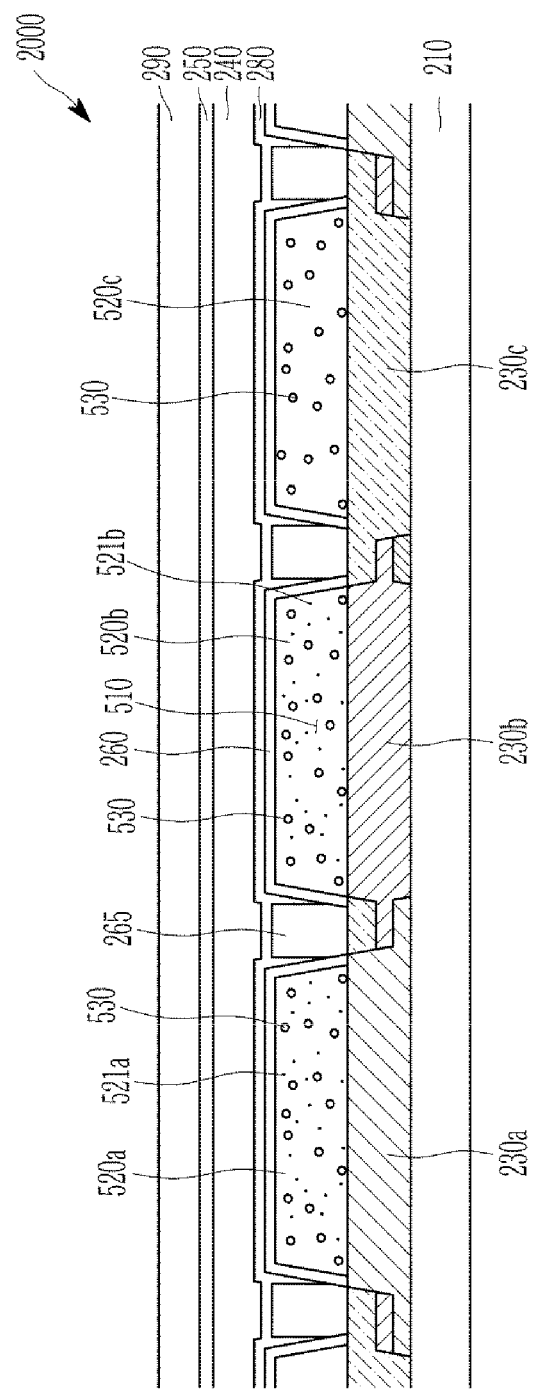
FIG. 13 is a cross-sectional view of a part of a display device according to an embodiment.

A display device according to an embodiment shown in FIG. 13 is almost the same as the display device according to the embodiment shown in FIG. 1 to FIG. 3, and therefore, the portions described above will not be described again here. The present embodiment is different from the previous embodiment in that positions of a low refractive index layer and a first capping layer are different from the previous embodiment, and will be further described below.

FIG. 13 is a cross-sectional view of a part of a display device according to an embodiment. FIG. 13 illustrates a color conversion panel of a display device according to an embodiment.

The display device according to an embodiment may include a display panel and a color conversion panel as in the previous embodiment.

As shown in FIG. 13, a color conversion panel of a display device according to an embodiment may include a substrate 210, and a first color filter 230a, a second color filter 230b, and a third color filter 230c on the substrate 210.

In the previous embodiment, the low refractive index layer 240 and the first capping layer 250 may be positioned on the first color filter 230a, the second color filter 230b and the third color filter 230c, and the first color conversion layer 520a, the second color conversion layer 520b, and the transmissive layer 520c may be positioned on the first capping layer 250. In the present embodiment, the first color conversion layer 520a, the second color conversion layer 520b, and the transmissive layer 520c are positioned on the first color filter 230a, the second color filter 230b, and the third color filter 230c, and the low refractive index layer and the first capping layer 250 may be positioned on the first color conversion layer 520a, the second color conversion layer 520b, and the transmissive layer 520c.

The first color conversion layer 520a may overlap the first color filter 230a, the second color conversion layer 520b may overlap the second color filter 230b, and the transmissive layer 520c may overlap the third color filter 230c. Although it is illustrated that the first color conversion layer 520a is on the first color filter 230a, the second color conversion layer 520b is on the second color filter 230b, and the transmissive layer 520c is on the third color filter 230c, but this is not restrictive. The insulation layer may be on the first color filter 230a, the second color filter 230b, and the third color filter 230c, and the first color conversion layer 520a, the second color conversion layer 520b, and the transmissive layer 520c may be on the insulation layer. In some embodiments, the insulation layers may be between the first color filter 230a and the first color conversion layer 520a, between the second color filter 230b and the second color conversion layer 520b, and between the third color filter 230c and the transmissive layer 520c.

The first color conversion layer 520a, the second color conversion layer 520b, and the transmissive layer 520c may be respectively in a plurality of spaces 510 covered by the roof layers 260. A partitioning wall 265 may be positioned between a plurality of adjacent roof layers 260. A second capping layer 280 may be positioned on the roof layer 260 and partitioning wall 265.

The low refractive index layer 240 may be positioned on the second capping layer 280. The first capping layer 250 may be positioned on the low refractive index layer 240. A filling layer 290 may be positioned on the first capping layer 250. The filling layer 290 is positioned between the display panel and the color conversion panel in a state where the display panel and the color conversion panel are attached.

Next, referring to FIG. 14, a display device according to an embodiment will be described.

Figure 14:
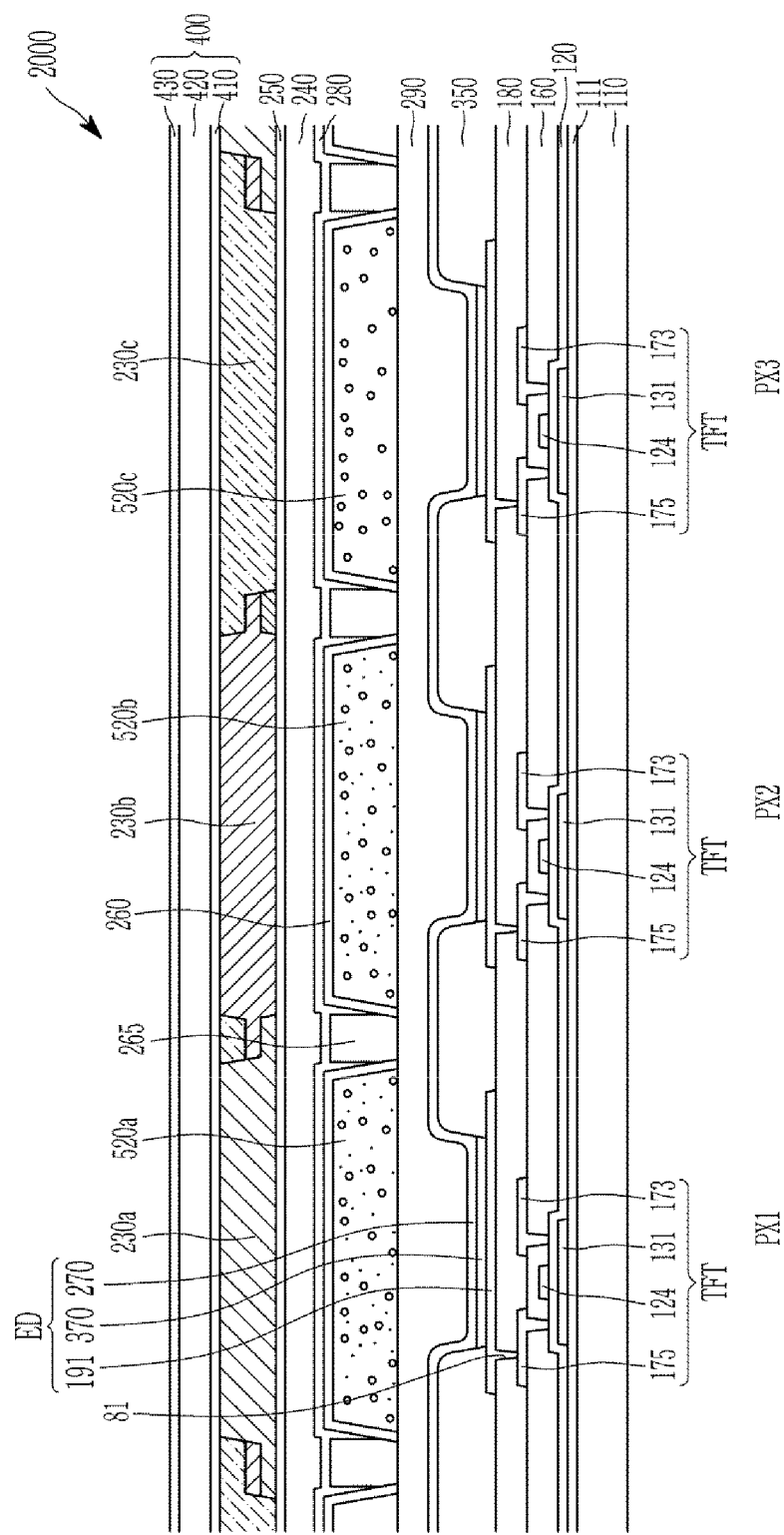
FIG. 14 is a cross-sectional view of a display device according to an embodiment.

A display device according to an embodiment shown in FIG. 14 is almost the same as the display device according to the embodiment shown in FIG. 1 to FIG. 3, and therefore, the portions described above will not be described again here. The present embodiment is different from the previous embodiment in that a display device includes one substrate, and a display panel and a color conversion panel are integrally formed, which will be described further below.

FIG. 14 is a cross-sectional view of a display device according to an embodiment.

As shown in FIG. 14, a display device according to an embodiment includes one substrate 110.

In the previous embodiment, the thin film transistor and the light emitting diode are formed on one substrate, the color filter and the color conversion layer are formed on another substrate, and then the two substrates are bonded such that the display device is formed. In the present embodiment, a thin film transistor TFT and a light emitting diode ED are formed on the substrate 110, a first color conversion layer 520a, a second color conversion layer 520b, and a transmissive layer 520c are formed on the light emitting diode ED, and then a first color filter 230a, a second color filter 230b, and a third color filter 230c may be formed. In the previous embodiment, the display panel and the color conversion panel are formed respectively, and the display device can be manufactured by combining them, and in the present embodiment, a display device can be manufactured by integrating the display panel and the color conversion panel. Accordingly, it is possible to reduce costs and simplify the process.

The thin film transistor TFT and the light emitting diode ED connected to the thin film transistor TFT may be positioned on the substrate 110. A filing layer 290 may be positioned on the light emitting diode ED.

The first color conversion layer 520a, the second color conversion layer 520b, and the transmissive layer 520c may be positioned on the filling layer 290. The first color conversion layer 520a may overlap a light emitting diode ED of a first pixel PX1, the second color conversion layer 520b may overlap a light emitting diode ED of the second pixel PX2, and the transmissive layer 520c may overlap a light emitting diode ED of a third pixel PX3.

The first color conversion layer 520a, the second color conversion layer 520b, and the transmissive layer 520c may be positioned in a plurality of spaces 510 covered by roof layers 260. A partitioning wall 265 may be positioned between a plurality of adjacent roof layers 260. A second capping layer 280 may be positioned on the roof layer 260 and partitioning wall 265.

A low refractive index layer 240 may be positioned on the second capping layer 280. A first capping layer 250 may be positioned on the low refractive index layer 240.

A first color filter 230a, a second color filter 230b, and a third color filter 230c may be positioned on the first capping layer 250. The first color filter 230a may overlap the first color conversion layer 520a and the light emitting diode ED of the first pixel PX1. The second color filter 230b may overlap the second color conversion layer 520b and the light emitting diode ED of the second pixel PX2. The third color filter 230c may overlap the transmissive layer 520c and the light emitting diode ED of the third pixel PX3.

An encapsulation layer 400 may be positioned on the first color filter 230a, the second color filter 230b, and the third color filter 230c. The encapsulation layer 400 may include a first inorganic encapsulation layer 410, an organic encapsulation layer 420, and a second inorganic encapsulation layer 430.

In the previous embodiment, a width of each of the first color conversion layer 520a, the second color conversion layer 520b, and the transmissive layer 520c may be gradually decreased as it moves away from the first color filter 230a, the second color filter 230b, and the third color filter 230c. The width of each of the first color conversion layer 520a, the second color conversion layer 520b, and the transmissive layer 520c may gradually increase as a distance from the light emitting diode ED increases. In the present embodiment, on the contrary, widths of the first color conversion layer 520a, the second color conversion layer 520b, and the transmissive layer 520c may gradually increase as a distance from the first color filter 230a, the second color filter 230b and the third color filter 230c increases. The widths of the first color conversion layer 520a, the second color conversion layer 520b, and the transmissive layer 520c may gradually decrease as a distance from the light emitting diode ED increases.

Next, referring to FIG. 15, a display device according to an embodiment will be described.

Figure 15:
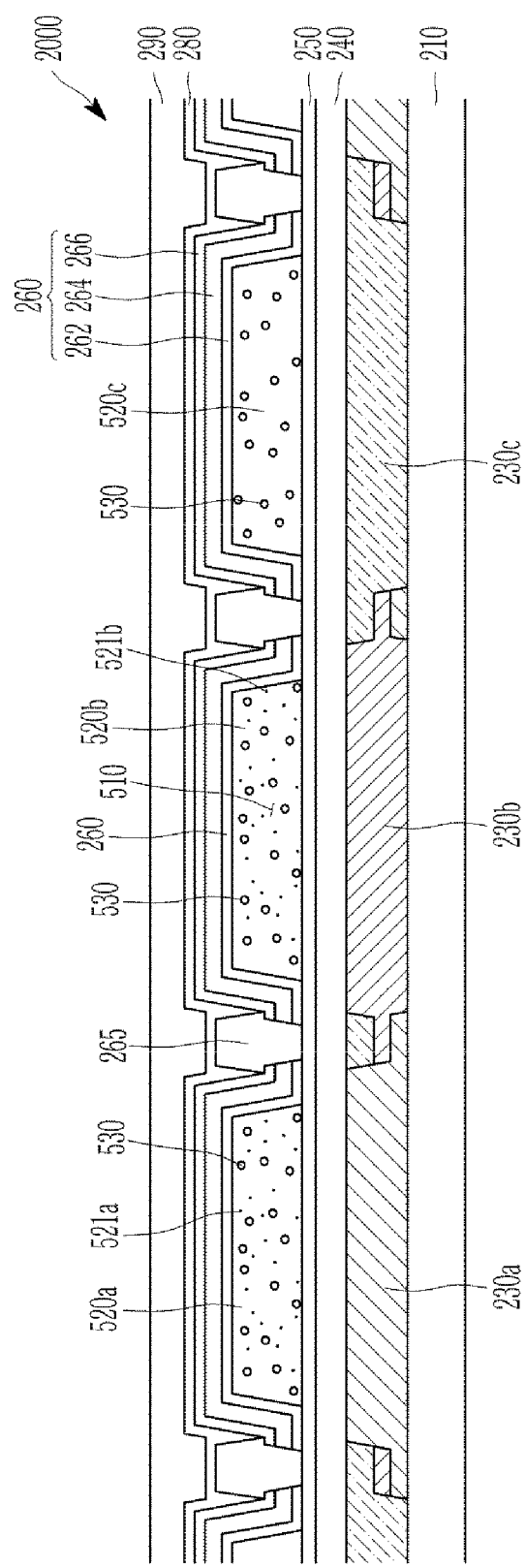
FIG. 15 is a cross-sectional view of a part of a display device according to an embodiment.

A display device according to an embodiment shown in FIG. 15 is almost the same as the display device according to the embodiment shown in FIG. 1 to FIG. 3, and therefore, the portions described above will not be described again here. The present embodiment is different from the previous embodiment in that a roof layer includes a plurality of layers, which will be further described below.

FIG. 15 is a cross-sectional view of a part of a display device according to an embodiment. FIG. 15 illustrates a color conversion panel of a display device according to an embodiment.

The display device according to an embodiment may include a display panel and a color conversion panel as in the previous embodiment.

As shown in FIG. 15, a color conversion panel of a display device according to an embodiment may include a substrate 210, and a first color filter 230a, a second color filter 230b, and a third color filter 230c on the substrate 210. A first color conversion layer 520a, a second color conversion layer 520b, and a transmissive layer 520c may be positioned on the first color filter 230a, the second color filter 230b, and the third color filter 230c.

The first color conversion layer 520a may overlap the first color filter 230a, the second color conversion layer 520b may overlap the second color filter 230b, and the transmissive layer 520c may overlap the third color filter 230c. It is illustrated that the first color conversion layer 520a is positioned on the first color filter 230a, the second color conversion layer 520b is positioned on the second color filter 230b, and the transmissive layer 520c is positioned on the third color filter 230c, but this is not restrictive. An insulation layer may be positioned on the first color filter 230a, the second color filter 230b, and the third color filter 230c, and the first color conversion layer 520a, the second color conversion layer 520b, and the transmissive layer 520c may be positioned on the insulation layer. In some embodiments, an insulation layer may be between the first color filter 230a and the first color conversion layer 520a, an insulation layer may be between the second color filter 230b and the second color conversion layer 520b, and an insulation layer may be between the third color filter 230c and the transmissive layer 520c.

The first color conversion layer 520a, the second color conversion layer 520b, and the transmissive layer 520c may be positioned in a plurality of space 510 covered by a roof layer 260, respectively.

In the present embodiment, the roof layer 260 may include a first roof layer 262, a second roof layer 264, and a third roof layer 266. The first roof layer 262 may be formed of an inorganic material, the second roof layer 264 may be formed of an organic material, and the third roof layer 266 may be formed of an inorganic material. The second roof layer 264 may be positioned between the first roof layer 262 and the third roof layer 266. However, this is only an example, and the number of inorganic and organic layers constituting the roof layer 260 may be variously changed. In addition, the second roof layer 264 may include an organic material having a low refractive index. For example, the refractive index of the second roof layer 264 may be greater than or equal to about 1.1 and less than or equal to about 1.3. Accordingly, the second roof layer 264 may replace the role of the low refractive index layer in the previous embodiment.

A partitioning wall 265 may be positioned between a plurality of adjacent roof layers 260. A second capping layer 280 may be positioned on the roof layer 260 and partitioning wall 265.

A filling layer 290 may be positioned on the second capping layer 280. The filling layer 290 is positioned between the display panel and the color conversion panel in a state where the display panel and the color conversion panel are attached.

Next, a display device according to an embodiment will be described with reference to FIG. 16 and FIG. 17.

Figure 16:
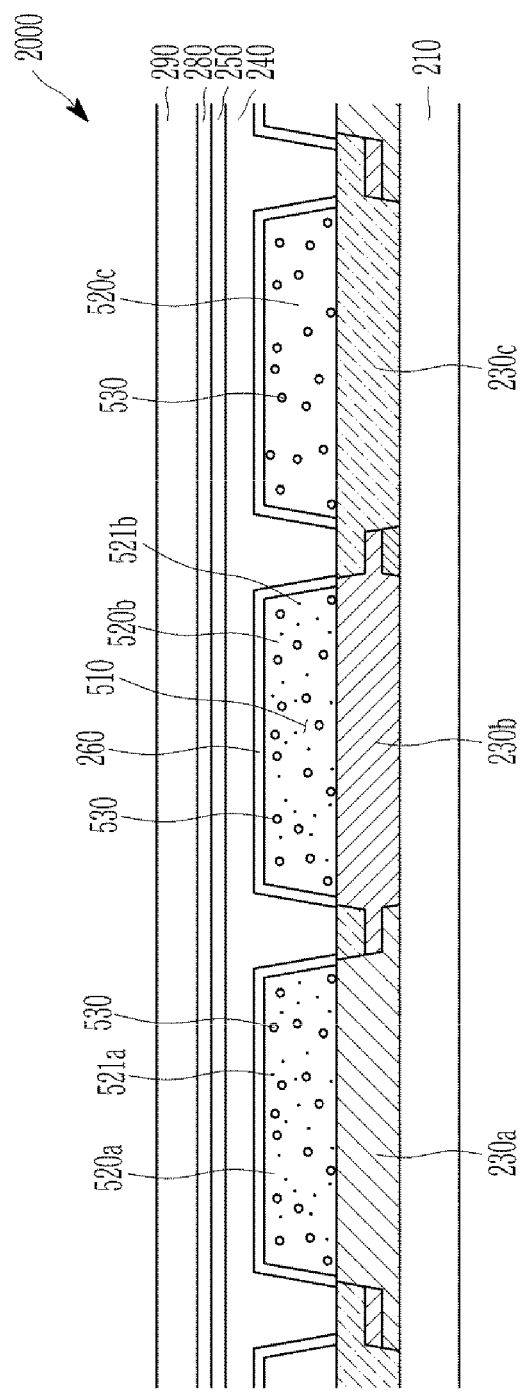
FIG. 16 is a cross-sectional view of a part of a display device according to an embodiment.
Figure 17:
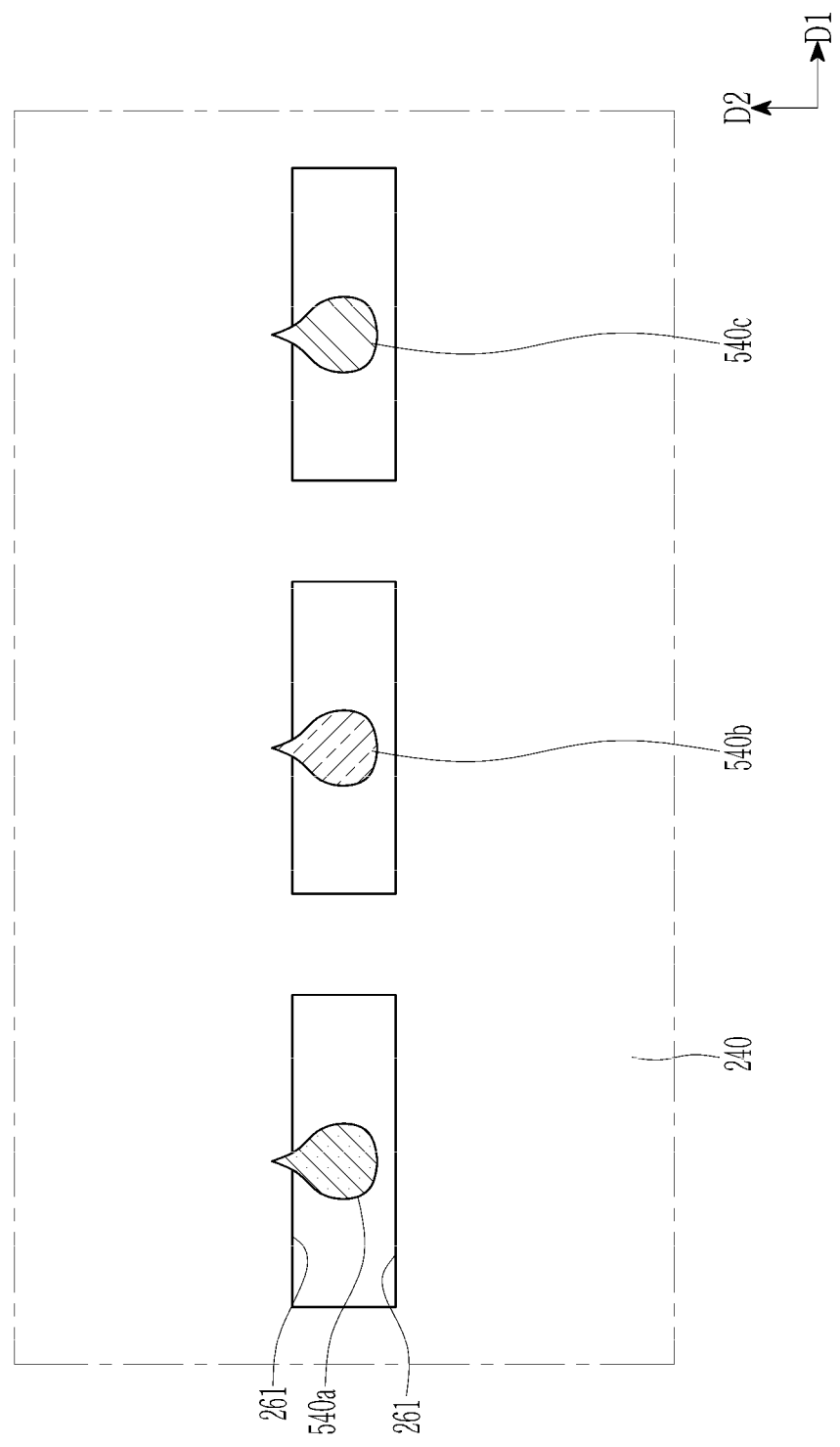
FIG. 17 is a top plan view of a part of a display device according to an embodiment.

A display device according to an embodiment shown in FIG. 16 and FIG. 17 is almost the same as the display device according to the embodiment shown in FIG. 1 to FIG. 3, and therefore, the portions described above will not be described again here. The present embodiment is different from the previous embodiment in that a partitioning wall is omitted, and will be further described below.

FIG. 16 is a cross-sectional view of a part of a display device according to an embodiment. FIG. 16 illustrates a color conversion panel of a display device according to an embodiment. FIG. 17 is a top plan view of a part of a display device according to an embodiment. FIG. 17 shows a low refractive index layer of a display device according to an embodiment.

The display device according to an embodiment may include a display panel and a color conversion panel as in the previous embodiment.

As shown in FIG. 16, a color conversion panel of a display device according to an embodiment may include a substrate 230, and a first color filter 230a, a second color filter 230b, and a third color filter 230c on the substrate 230. A first color conversion layer 520a, a second color conversion layer 520b, and a transmissive layer 520c may be positioned on the first color filter 230a, the second color filter 230b, and the third color filter 230c.

The first color conversion layer 520a may overlap the first color filter 230a, the second color conversion layer 520b may overlap the second color filter 230b, and the transmissive layer 520c may overlap the third color filter 230c. It is illustrated that the first color conversion layer 520a is positioned on the first color filter 230a, the second color conversion layer 520b is positioned on the second color filter 230b, and the transmissive layer 520c is positioned on the third color filter 230c, but this is not restrictive. An insulation layer may be positioned on the first color filter 230a, the second color filter 230b, and the third color filter 230c, and the first color conversion layer 520a, the second color conversion layer 520b, and the transmissive layer 520c may be positioned on the insulation layer. In some embodiments, an insulation layer may be between the first color filter 230a and the first color conversion layer 520a, an insulation layer may be between the second color filter 230b and the second color conversion layer 520b, and an insulation layer may be between the third color filter 230c and the transmissive layer 520c.

The first color conversion layer 520a, the second color conversion layer 520b, and the transmissive layer 520c may be positioned in a plurality of space 510 covered by a roof layer 260, respectively.

In the previous embodiment, a partitioning wall may be positioned between a plurality of roof layers 260 that are adjacent to each other, and in the present embodiment, such a partitioning wall may be omitted.

A low refractive index layer 240 may be positioned on the roof layer 260. The low refractive index layer 240 may overlap the first color conversion layer 520a, the second color conversion layer 520b, and the transmissive layer 520c. In addition, the low refractive index layer 240 may be positioned between a plurality of adjacent roof layers 260, and may serve as a partitioning wall in the previous embodiment. As shown in FIG. 17, the low refractive index layer 240 may be formed between the adjacent roof layers 260 in a first direction D1. The low refractive index layer 240 may extend long along a second direction D2 that is perpendicular (e.g., substantially perpendicular) to the first direction D1. An upper surface of the low refractive index layer 240 may be hydrophobic. The low refractive index layer 240 may be patterned so as not to be formed between the adjacent roof layers 260 in the second direction D2. In some embodiments, the low refractive index layer 240 may be patterned so as not to cover a portion where an injection hole 261 is formed.

A first capping layer 250 may be positioned on the low refractive index layer 240. The first capping layer 250 may be patterned to have the same planar shape as the low refractive index layer 240.

After forming the low refractive index layer 240 and the first capping layer 250, inks 540a, 540b, and 540c may be dropped. The inks 540a, 540b, and 540c may be injected into a space 510 through the injection hole 261.

A second capping layer 280 may be positioned on the first capping layer 250. The second capping layer 280 may be formed to cover the injection hole 261.

A filling layer 290 may be positioned on the second capping layer 280. The filling layer 290 is positioned between the display panel and the color conversion panel in a state where the display panel and the color conversion panel are attached.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims, and equivalents thereof.

REFERENCE NUMERALS 110, 210: substrate
230a: first color filter
230b: second color filter
230c: third color filter
240: low refractive index layer
260: roof layer
265: partitioning wall
280: second capping layer
290: filling layer
400: encapsulation layer
500: sacrificial layer
510: space
520a: first color conversion layer
520b: second color conversion layer
520c: transmissive layer
521a: first quantum dot
521b: second quantum dot
530: scatterer
ED: light emitting element

What is claimed is:

1. A display device comprising:
a first substrate;
a first color filter, a second color filter, and a third color filter that are on the first substrate;
a plurality of roof layers that cover spaces that overlap the first color filter, the second color filter, and the third color filter, respectively;
a first color conversion layer that is positioned in a space overlapping the first color filter;
a second color conversion layer that is positioned in a space overlapping the second color filter;
a transmissive layer that is positioned in a space overlapping the third color filter;
a partitioning wall that is positioned between the plurality of roof layers; and
a capping layer that is positioned on the partitioning wall.

2. The display device of claim 1, wherein:
the first color conversion layer comprises a plurality of first quantum dots and a plurality of scatterers;
the second color conversion layer comprises a plurality of second quantum dots and a plurality of scatterers; and
the transmissive layer comprises a plurality of scatterers.

3. The display device of claim 1, wherein:
an upper surface of the partitioning wall has hydrophobicity.

4. The display device of claim 1, further comprising a low refractive index layer that is positioned on the first color filter, the second color filter, and the third color filter,
wherein the low refractive index layer is positioned between the first color filter and the first color conversion layer, between the second color filter and the second color conversion layer, and between the third color filter and the transmissive layer.

5. The display device of claim 1, further comprising a low refractive index layer that is positioned on the first color conversion layer, the second color conversion layer, and the transmissive layer,
wherein the first color conversion layer is between the first color filter and the low refractive index layer,
the second color conversion layer is between the second color filter and the low refractive index layer, and
the transmissive layer is between the third color filter and the low refractive index layer.

6. The display device of claim 1, further comprising:
a second substrate that includes a first pixel, a second pixel, and a third pixel; and
a plurality of light emitting elements that are respectively on the first pixel, the second pixel, and the third pixel of the second substrate,
wherein a light emitting element on the first pixel overlaps the first color filter and the first color conversion layer,
a light emitting element on the second pixel overlaps the second color filter and the second color conversion layer, and
a light emitting element on the third pixel overlaps the third color filter and the transmissive layer.

7. The display device of claim 1, wherein:
the first substrate further comprises a first pixel, a second pixel, and a third pixel,
the display device further comprises a plurality of light emitting elements that are on the first pixel, the second pixel, and the third pixel of the second substrate, respectively,
a light emitting element on the first pixel is positioned between the first substrate and the first color conversion layer, while overlapping the first color filter and the first color conversion layer,
a light emitting element on the second pixel is positioned between the first substrate and the second color conversion layer, while overlapping the second color filter and the second color conversion layer, and a light emitting element on the third pixel is positioned between the first substrate and the transmissive layer, while overlapping the third color filter and the transmissive layer.

8. The display device of claim 1, further comprising a filling layer that is positioned on the capping layer.

9. A display device comprising:
a first substrate;
a first color filter, a second color filter, and a third color filter that are on the first substrate;
a plurality of roof layers that cover spaces that overlap the first color filter, the second color filter, and the third color filter, respectively;
a first color conversion layer that is positioned in a space overlapping the first color filter;
a second color conversion layer that is positioned in a space overlapping the second color filter;
a transmissive layer that is positioned in a space overlapping the third color filter; and
a capping layer that is positioned on the plurality of roof layers,
wherein:
the plurality of roof layers comprise:
a first roof layer formed of an inorganic material;
a second roof layer that is positioned on the first roof layer, and is formed of an organic material; and
a third roof layer that is positioned on the second roof layer, and is formed of an inorganic material.

10. A manufacturing method of a display device comprising:
forming a first color filter, a second color filter, and a third color filter on a first substrate;
forming a sacrificial layer on each of the first color filter, the second color filter, and the third color filter;
forming a plurality of roof layers on the sacrificial layer;
forming a space covered by the plurality of roof layers by removing the sacrificial layer;
forming a first color conversion layer, a second color conversion layer, and a transmissive layer by injecting ink into the space;
forming a partitioning wall that is positioned between the plurality of roof layers; and
forming a capping layer on the partitioning wall.

11. The manufacturing method of the display device of claim 10, wherein:
the first color conversion layer includes a plurality of first quantum dots and a plurality of scatterers,
the second color conversion layer comprises a plurality of second quantum dots and a plurality of scatterers, and
the transmissive layer comprises a plurality of scatterers.

12. The manufacturing method of the display device of claim 11,
wherein in the forming of the partitioning wall, the sacrificial layer is removed.

13. The manufacturing method of the display device of claim 12, wherein:
the sacrificial layer is formed of a positive photoresist, and the partitioning wall is formed of a negative photoresist.

14. The manufacturing method of the display device of claim 10, further comprising forming a low refractive index layer on the first color filter, the second color filter, and the third color filter,
wherein the low refractive index layer is positioned between the first color filter and the first color conversion layer, between the second color filter and the second color conversion layer, and between the third color filter and the transmissive layer.

15. The manufacturing method of the display device of claim 10, further comprising forming a low refractive index layer on the first color conversion layer, the second color conversion layer, and the transmissive layer,
wherein the first color conversion layer is positioned between the first color filter and the low refractive index layer,
the second color conversion layer is positioned between the second color filter and the low refractive index layer, and
the transmissive layer is positioned between the third color filter and the low refractive index layer.

16. The manufacturing method of the display device of claim 10, further comprising:
forming a plurality of light emitting diodes on a second substrate; and
aligning the first substrate and the second substrate to face each other and bonding them.

17. The manufacturing method of the display device of claim 10, further comprising forming a plurality of light emitting diodes on the first substrate,
and sequentially forming the sacrificial layer on the plurality of light emitting diodes, forming the plurality of roof layers, forming the space, forming the first color conversion layer, the second color conversion layer, and the transmissive layer, and forming the capping layer, and then
the forming the first color filter, the second color filter, and the third color filter on the first color conversion layer, the second color conversion layer, and the transmissive layer is carried out.

18. The manufacturing method of the display device of claim 10, wherein:
the forming the plurality of roof layers comprises:
forming a first roof layer formed of an inorganic material;
forming a second roof layer formed of an organic material on the first roof layer; and
forming a third roof layer formed of an inorganic material on the second roof layer.

19. The manufacturing method of the display device of claim 10, further comprising forming a filling layer on the capping layer.

* * * * *